United States Patent
Yeo et al.

(10) Patent No.: US 11,862,995 B2
(45) Date of Patent: Jan. 2, 2024

(54) METHOD, ELECTRONIC DEVICE, AND STORAGE MEDIUM FOR PERFORMING ADAPTIVE IMPEDANCE MATCHING

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Sungku Yeo, Suwon-si (KR); Jaeseok Park, Suwon-si (KR); Kangyoon Lee, Suwon-si (KR); Chongmin Lee, Suwon-si (KR); Imran Ali, Suwon-si (KR); Kwangtae Kim, Suwon-si (KR); Dongin Kim, Suwon-si (KR); Seongjin Oh, Suwon-si (KR); Solhee In, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 42 days.

(21) Appl. No.: 17/448,256

(22) Filed: Sep. 21, 2021

(65) Prior Publication Data
US 2022/0006333 A1 Jan. 6, 2022

Related U.S. Application Data

(63) Continuation of application No. PCT/KR2020/003700, filed on Mar. 18, 2020.

(30) Foreign Application Priority Data

Mar. 29, 2019 (KR) .......................... 10-2019-0037254

(51) Int. Cl.
*H02J 50/90* (2016.01)
*H02J 50/80* (2016.01)
(Continued)

(52) U.S. Cl.
CPC .............. *H02J 50/90* (2016.02); *G06N 3/045* (2023.01); *G06N 20/00* (2019.01); *H02J 50/80* (2016.02); *H02J 50/12* (2016.02)

(58) Field of Classification Search
None
See application file for complete search history.

(56) References Cited

U.S. PATENT DOCUMENTS

2008/0119214 A1* 5/2008 Liu .......................... H03F 3/72
455/92
2011/0221416 A1 9/2011 Ivanov et al.
(Continued)

FOREIGN PATENT DOCUMENTS

JP 2014-166063 9/2014
KR 10-2011-0067061 6/2011
(Continued)

OTHER PUBLICATIONS

International Search Report for PCT/KR2020/003700 dated Jun. 29, 2020, 4 pages.
(Continued)

*Primary Examiner* — Daniel Kessie
(74) *Attorney, Agent, or Firm* — Nixon & Vanderhye P.C.

(57) ABSTRACT

The present disclosure relates to an artificial intelligence (AI) system which simulates functions such as cognition, judgment, and the like of the human brain by utilizing machine learning algorithms such as deep learning and the like, and to an application thereof. According to various embodiments, an electronic device may comprise: a first impedance matching circuit configured to perform a first impedance matching on a power signal wirelessly received from a wireless power transmission device; a second impedance matching circuit configured to perform a second impedance matching on the first impedance-matched power signal using any one impedance value among a plurality of impedance values; a control circuit configured to perform control to change an impedance value of the second impedance matching circuit to an impedance value learned using an impedance matching network model, corresponding to a power and a frequency of the second impedance-matched power signal; and a power conversion circuit configured to convert a second impedance-matched power signal in an AC form into a power in a DC form for charging a battery according to the changed impedance value.

13 Claims, 13 Drawing Sheets

(51) Int. Cl.
*G06N 20/00* (2019.01)
*G06N 3/045* (2023.01)
*H02J 50/12* (2016.01)

(56) References Cited

U.S. PATENT DOCUMENTS

| | | |
|---|---|---|
| 2011/0298294 A1 | 12/2011 | Takada |
| 2012/0038220 A1 | 2/2012 | Kim et al. |
| 2013/0113298 A1 | 5/2013 | Ryu et al. |
| 2016/0072339 A1* | 3/2016 | Shichino ................ H02J 50/40 320/108 |
| 2016/0118806 A1 | 4/2016 | Standke et al. |
| 2016/0134191 A1 | 5/2016 | Teggatz et al. |
| 2016/0190872 A1 | 6/2016 | Bohn et al. |
| 2017/0117818 A1 | 4/2017 | Shao |
| 2017/0256953 A1 | 9/2017 | Nishimura |
| 2018/0212644 A1* | 7/2018 | Nakajima ................ H04B 1/40 |
| 2019/0044392 A1 | 2/2019 | Chowdhury et al. |

FOREIGN PATENT DOCUMENTS

| | | |
|---|---|---|
| KR | 10-2012-0015921 | 2/2012 |
| KR | 10-2013-0050783 | 5/2013 |
| KR | 10-2014-0129915 | 11/2014 |
| KR | 10-2015-0112597 | 10/2015 |
| WO | 2017-116630 | 7/2017 |

OTHER PUBLICATIONS

Written Opinion of the ISA for PCT/KR2020/003700 dated Jun. 29, 2020, 5 pages.
Korean Office Action dated Nov. 8, 2023 for KR Application No. 10-2019-0037254.

* cited by examiner

METHOD, ELECTRONIC DEVICE, AND STORAGE MEDIUM FOR PERFORMING ADAPTIVE IMPEDANCE MATCHING

CROSS-REFERENCE TO RELATED APPLICATIONS

This application is continuation of International Application No. PCT/KR2020/003700, filed on Mar. 18, 2020, which claims priority to Korean Patent Application No. 10-2019-0037254 filed on Mar. 29, 2019 in the Korean Intellectual Property Office, the disclosures of which are herein incorporated by reference.

BACKGROUND

Field

The disclosure relates to a method, an electronic device, and a storage medium for performing adaptive impedance matching.

Description of Related Art

An Artificial Intelligence (AI) system may refer to a computer system for implementing intelligence at the level of human intelligence, in which a machine learns, judges, and becomes smarter by itself, unlike the conventional rule-based smart system. With use, the AI system may improve a recognition rate and more accurately understand a user's taste, and thus the conventional rule-based smart system has been gradually replaced with a deep-learning-based AI system.

AI technology includes machine learning (deep-learning) and element technologies using machine learning.

Machine learning may refer to an algorithm-based technology of autonomously classifying/learning features of input data, and element technology is a technology of simulating cognitive and judgment functions of human brains based on a machine-learning algorithm such as a deep-learning algorithm and includes technology fields such as linguistic understanding, visual understanding, inference/prediction, knowledge representation, and operation control.

Various fields to which AI technology is applied may include the following. Linguistic understanding may refer to a technology for recognizing and applying/processing human languages/characters and may include natural language processing, machine translation, dialogue systems, question-and-answer systems, and voice recognition/synthesis. Visual understanding may refer to a technology for recognizing and processing an object in the manner of human vision, and includes object recognition, object tracking, image searching, person recognition, scene understanding, space understanding, and image improvement. Inference/prediction may refer to a technology for determining information to logically infer and predict the same, and includes knowledge/probability-based inference, optimization prediction, preference-based planning, and recommendation. Knowledge representation may refer to a technology for automatic processing of information on human experience to obtain knowledge data, and includes knowledge construction (data creation/classification) and knowledge management (data use). Operation control may refer to a technology for controlling autonomous driving of vehicles and movement of robots, and includes movement control (navigation, collision, and driving) and manipulation control (behavior control).

The Internet of Things (IoT), in which intelligent objects are connected to the Internet and communication is exchanged through a network between people and objects and between objects themselves without depending on people, has spread in recent years.

In order to realize the IoT technology, a technique for developing low power communication devices which can be easily mounted to objects and smoothly supplying power to a plurality of communication devices mounted to various objects is needed. In such a situation, RF wireless power transmission and RF energy harvesting technologies are highlighted as methods of efficiently supplying power to an IoT device.

Wireless power transmission may include, for example, a magnetic induction scheme, a magnetic resonance scheme, and an electromagnetic scheme. The magnetic induction or magnetic resonance scheme is advantageous to charge an electronic device located relatively close to a wireless power transmission device. The electromagnetic scheme is more advantageous for remote power transmission across several meters more than the magnetic induction or magnetic resonance scheme. An electronic device wirelessly receiving power on the basis of the electromagnetic scheme may wirelessly receive power by converting Radio Frequency (RF) waves formed from a wireless power transmission device into electrical energy.

The RF energy harvesting technology has an advantage of securing energy through a technology of receiving RF energy in the air and using the RF energy as power of the electronic device without a separate energy supply.

The wireless power transmission system aims at wirelessly transmitting power and should be designed to focus on power consumption due to changes and transmission distances of a receiving side and a transmitting side, space loss, and other environment factors. Further, an energy harvesting system is required to support maximum power to an output load end with high efficiency.

However, since impedance varies depending on various factors in wireless power transmission, impedance matching may be of importance to secure energy of RF signals in various frequency bands.

Further, the magnitude of power received by an electronic device may be changed in a relatively wide range according to various reasons. Accordingly, a method of processing power with high efficiency is needed, and thus a method of performing impedance matching at an improved speed and accuracy is needed.

SUMMARY

According to various example embodiments, an electronic device includes: a first impedance matching circuit configured to perform first impedance matching on a power signal wirelessly received from a wireless power transmission device; a second impedance matching circuit configured to perform second impedance matching on the first impedance-matched power signal using one of a plurality of impedance values; a control circuit configured to control the electronic device to change an impedance value of the second impedance matching circuit to an impedance value learned using an impedance matching network model based on a power and a frequency of the second impedance-matched power signal; and a power conversion circuit configured to convert the second impedance-matched power signal in an AC form into a power in a DC form for charging a battery based on the changed impedance value.

According to various example embodiments, an electronic device includes: an antenna configured to wirelessly receive a power signal; an impedance matching circuit configured to perform impedance matching on the power signal using one of a plurality of impedance values; at least one processor; and a memory, wherein the memory stores instructions that, when executed, cause the at least one processor to control the electronic device to: change an impedance value of the impedance matching circuit to an impedance value learned using an impedance matching network model based on a power and a frequency of the impedance-matched power signal.

According to various example embodiments, a method of performing adaptive impedance matching by an electronic device includes: performing first impedance matching on a wirelessly received power signal through a first impedance matching circuit; performing second impedance matching on the first impedance-matched power signal through a second impedance matching circuit using one of a plurality of impedance values; controlling to change an impedance value of the second impedance matching circuit to an impedance value learned using an impedance matching network model based on a power and a frequency of the second impedance-matched power signal; and converting a second impedance-matched power signal in an AC form to a power in a DC form for charging a battery based on the changed impedance value.

Embodiments of the disclosure provide an energy harvesting system having increased efficiency without implementation of multiple antennas for various inputs.

Embodiments of the disclosure have an effect of detecting a frequency of received power and the power magnitude and applying an impedance matching value learned using an impedance matching network model in accordance with the detected frequency and power magnitude, and thus performing fast and accuracy-improved impedance matching with maximum efficiency.

In various example embodiments, it is possible to store an impedance matching value having maximum efficiency by tracking a point at which a frequency at an input terminal of an RF-DC converter and power for the frequency are maximized and/or improved within an energy harvesting system.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

The terms used in the disclosure are used to describe various example embodiments, and are not intended to limit the disclosure. A singular expression may include a plural expression unless they are clearly different in context. All terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even where the term is defined in the disclosure, it should not be interpreted to exclude embodiments of the disclosure.

Figure 1:
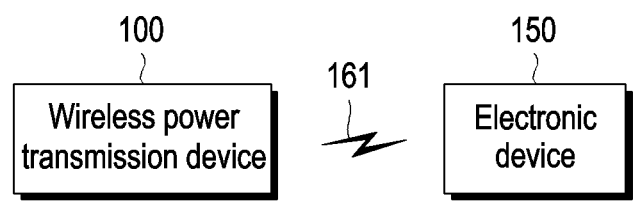
FIG. 1 is a block diagram illustrating an example wireless power transmission device and an electronic device according to various embodiments.

FIG. 1 is a block diagram illustrating an example wireless power transmission device and an electronic device according to various embodiments.

Referring to FIG. 1, a wireless power transmission device 100 according to various embodiments may wirelessly transmit power 161 to an electronic device 150. The wireless power transmission device 100 may transmit the power 161 to the electronic device 150 according to various charging schemes. For example, the wireless power transmission device 100 may transmit the power 161 according to an induction scheme. However, it will be understood that the disclosure is not limited thereto.

When the wireless power transmission device 100 is based on the induction scheme, the wireless power transmission device 100 may include, for example, a power source, a DC-AC converting circuit, an amplification circuit, an impedance matching circuit, at least one capacitor, at least one coil, a communication modulation/demodulation circuit, and the like. At least one capacitor may configure a resonance circuit with at least one coil.

The wireless power transmission device 100 may, for example, and without limitation, be implemented in a manner defined in the Wireless Power Consortium (WPC) standard (or Qi standard). For example, the wireless power transmission device 100 may transmit the power 161 according, for example, and without limitation, to a resonance scheme. According to the resonance scheme, the wireless power transmission device 100 may include, for example, a power source, a DC-AC converting circuit, an amplification circuit, an impedance matching circuit, at least one capacitor, at least one coil, an out-band communication circuit (for example, a Bluetooth Low Energy (BLE) communication circuit), and the like. At least one capacitor and at least one coil may configure a resonance circuit.

The wireless power transmission device 100 may be implemented, for example, and without limitation, in a manner defined in the Alliance for Wireless Power (A4WP) standard (or Air Fuel Alliance (AFA)). The wireless power transmission device 100 may include a coil that can generate an induced magnetic field when the current flows according to the resonance scheme or the induction scheme. A process in which the wireless power transmission device 100 generates the induced magnetic field may be expressed as wireless transmission of the power 161 by the wireless power transmission device 100. Further, the electronic device 150 may include a coil for generating an induced electromotive force by a magnetic field formed therearound, of which the magnitude is changed according to the time. A process in which the electronic device 150 generates the induced electromotive force through the coil may be expressed as wireless reception of the power 161 by the electronic device 150.

For example, the wireless power transmission device 100 may transmit the power 161 according, for example, and without limitation, to an electromagnetic scheme. When the wireless power transmission device 100 is based on the electromagnetic scheme, the wireless power transmission device 100 may include, for example, a power source, a DC-AC converting circuit, an amplification circuit, a distribution circuit, a phase shifter, a power transmission antenna array including a plurality of patch antennas, an out-band communication circuit (for example, a BLE communication module), and the like. Each of the plurality of patch antennas may form Radio Frequency (RF) waves (for example, electromagnetic waves). The electronic device 150 may include a patch antenna capable of outputting the current using the RF waves formed therearound. A process in which the wireless power transmission device 100 forms the RF waves may be expressed as wireless transmission of the power 161 by the wireless power transmission device 100. A process in which the electronic device 150 outputs the current from the patch antenna using the RF waves may be expressed as wireless reception of the power 161 by the electronic device 150.

The wireless power transmission device 100 according to various embodiments may communicate with the electronic device 150. For example, the wireless power transmission device 100 may communicate with the electronic device 150 according to an in-band scheme. The wireless power transmission device 100 or the electronic device 150 may change a load (or impedance) of data to be transmitted according to, for example, an on/off keying modulation scheme. The wireless power transmission device 100 or the electronic device 150 may measure a load change (or impedance change) on the basis of a change in the magnitude of the current, voltage, or power of the coil, to determine data transmitted by a counterpart device. For example, the wireless power transmission device 100 may communicate with the electronic device 150 according to an out-band scheme. The wireless power transmission device 100 or the electronic device 150 may transmit and receive data using a communication circuit (for example, a BLE communication module) separated from the coil or the patch antenna.

In the disclosure, the performance of a specific operation by the wireless power transmission device 100, the electronic device 150, or another electronic device may refer, for example, to the performance of the specific operation by various hardware devices included in the wireless power transmission device 100, the electronic device 150, or another electronic device, for example, a control circuit such as a processor, a coil, a patch antenna, or the like. The the performance of a specific operation by the wireless power transmission device 100, the electronic device 150, or another electronic device may refer, for example, to the processor controlling another hardware device to perform the specific operation. The performance of a specific operation by the wireless power transmission device 100, the electronic device 150, or another electronic device may refer, for example, to instructions stored in a storage circuit (for example, a memory) of the wireless power transmission device 100, the electronic device 150, or another electronic device to perform the specific operation causing the processor or another hardware device to perform the specific operation when the instruction is executed.

Figure 2:
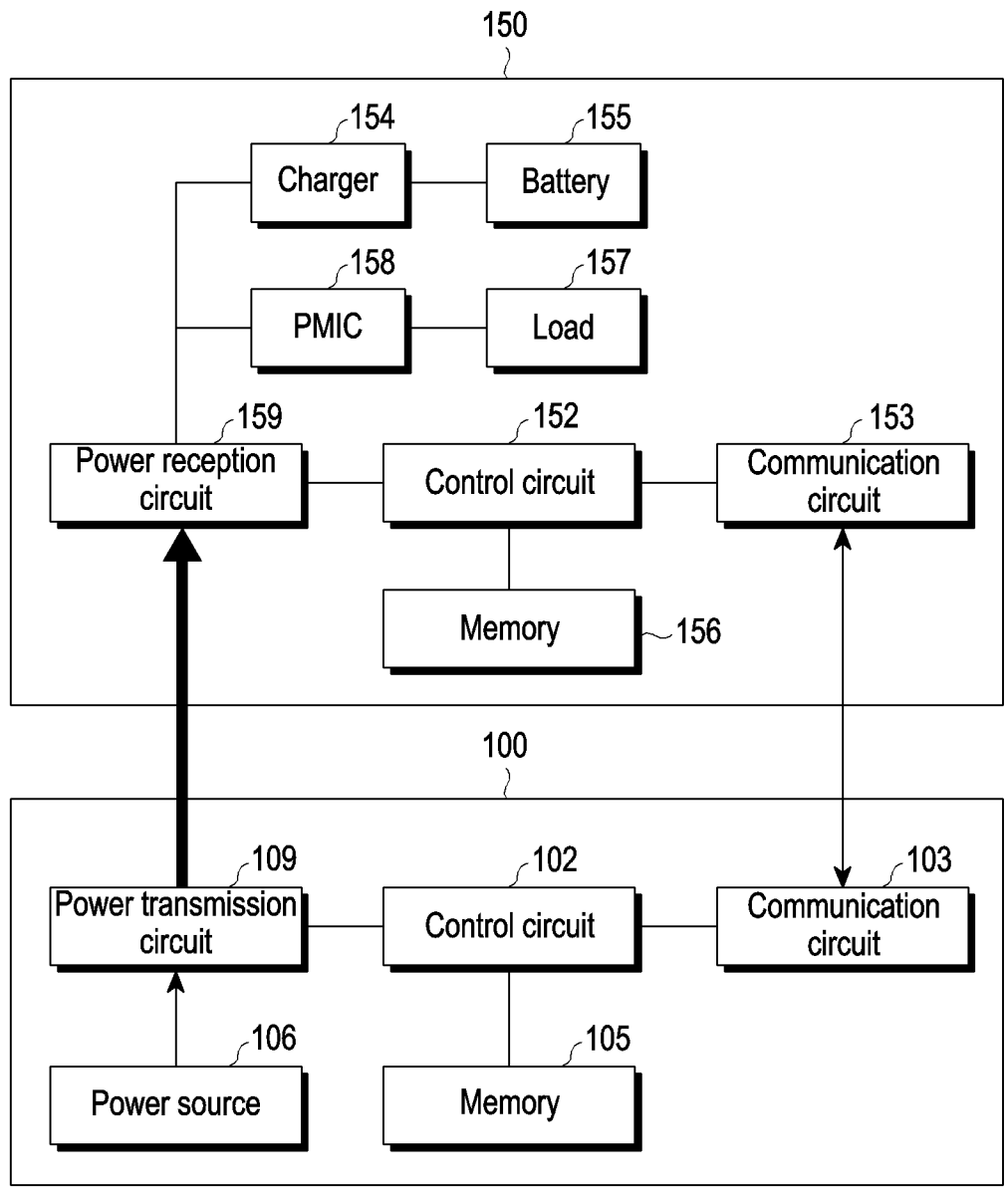
FIG. 2 is a block diagram illustrating a wireless power transmission device and an electronic device according to various embodiments.

FIG. 2 is a block diagram illustrating an example wireless power transmission device and an electronic device according to various embodiments.

The wireless power transmission device 100 according to various embodiments may include a power transmission circuit 109, a control circuit 102, a communication circuit 103, a memory 105, and a power source 106. The electronic device 150 according to various embodiments may include a power reception circuit 159, a control circuit 152, a communication circuit 153, a memory 156, a charger 154, a battery 155, a Power Management Integrated Circuit (PMIC) 158, and a load 157.

The power transmission circuit 109 according to various embodiments may wirelessly transmit power to the power reception circuit 159 according, for example, and without limitation, to at least one of the induction scheme, the resonance scheme, or the electromagnetic scheme. Example configurations of the power transmission circuit 109 and the power reception circuit 159 are described in greater detail below with reference to FIGS. 3A and 3B. The control circuit 102 may control the magnitude of power transmitted by the power transmission circuit 109.

For example, the control circuit 102 may control the magnitude of power output from the power source 106 or control an amplitude gain of a power amplifier included in the power transmission circuit 109, to control the magnitude of the power transmitted by the power transmission circuit 109. The control circuit 102 may adjust the magnitude of the power output from the power source 106 by controlling a duty cycle or a frequency of the power output from the power source 106. The power source 106 may include, for example, a power interface which can be connected to a wall power source and may receive AC power having a voltage configured for each country from the wall power source and transmit the same to the power transmission circuit 109.

The control circuit 102 may control the magnitude of power applied to the power transmission circuit 109 by controlling the magnitude of a bias voltage of the power amplifier.

The control circuit 102 or the control circuit 152 may be implemented as any of various processing circuitry, such as, for example, and without limitation, a general-purpose processor like a CPU, a dedicated processor, a mini computer, a microprocessor, a Micro Controlling Unit (MCU), a Field- Programmable Gate Array (FPGA) that may perform calculations, and the like but there is no limitation as to the type thereof.

The power reception circuit 159 according to various embodiments may wirelessly receive power from the power transmission circuit 109 according, for example, and without limitation, to at least one of the induction scheme, the resonance scheme, or the electromagnetic scheme. For example, the power reception circuit 159 may include a power reception antenna for wirelessly receiving a power signal.

The power reception circuit 159 may rectify received AC waveform power to DC waveform power, convert a voltage, or process power by regulating the power. According to various embodiments, the power reception circuit 159 may include at least one impedance matching circuit. According to an embodiment, the power reception circuit 159 may include a fixed impedance matching circuit configured to match impedance of power reception antennas. Further, the power reception circuit 159 may further include a variable adaptive impedance matching circuit connected to an output terminal of the fixed impedance matching circuit. For example, the adaptive impedance matching circuit may be configured to match impedance for power signals using one of a plurality of impedance values. According to various embodiments, the fixed impedance matching circuit may be implemented between the adaptive impedance matching circuit and the antenna, but may be omitted as necessary. Example configurations of the fixed impedance matching circuit and the adaptive impedance matching circuit are described in greater detail below with reference to FIG. 4.

The charger 154 may charge the battery 155 of the electronic device 150. The charger 154 may charge the battery 155 in, for example, and without limitation, a Constant Voltage (CV) mode, a Constant Current (CC) mode, or the like, but there is no limitation as to the charging mode. The PMIC 158 may adjust a voltage or current suitable for the connected load 157 and provide the voltage or current to the load 157. The control circuit 152 may control the overall operation of the electronic device 150, and at least one processor may replace the control circuit 152. The memory 156 may store instructions for performing the overall operation of the electronic device 150. The memory 105 may store instructions for performing the operation of the wireless power transmission device 100. The memory 105 or the memory 156 may be implemented in various forms such as, for example, and without limitation, a Read Only Memory (ROM), a Random Access Memory (RAM), a flash memory, and the like, but there is no limitation as to the implementation form thereof.

According to various embodiments, the memory 105 may store instructions which, when executed, cause the at least one processor to perform control to change an impedance value of the impedance matching circuit to an impedance value learned using an impedance matching network model in accordance with a power and a frequency of the impedance-matched power signal.

According to an embodiment, the impedance matching network model may be configured to sequentially acquire second impedance-matched power signals using the plurality of impedance values, identify a maximum power signal among the second impedance-matched power signals on the basis of comparison between powers of the second impedance-matched power signals, and change an impedance value of the second impedance matching circuit to the learned impedance value which is an impedance value corresponding to the maximum power signal among the plurality of impedance values.

According to an embodiment, the impedance value leaned using the impedance matching network model may include an impedance value causing a maximum power of another power signal for a detected frequency and power among the plurality of impedance values on the basis of detection of a power and the frequency of the another power signal output from the impedance matching circuit.

According to an embodiment, the impedance matching circuit may include a plurality of circuits corresponding to the plurality of impedance values, and the plurality of circuits may include at least one capacitor and at least one switch configured to switch a short circuit of the at least one capacitor.

According to various embodiments, the electronic device 150 may include a power conversion circuit configured to convert the impedance-matched power signal in an AC form into a power in a DC form for a battery according to the changed impedance value. According to an embodiment, the power conversion circuit may be included in the power reception circuit 159.

According to various embodiments, the instructions may be configured to cause the at least one processor to detect an input power between an output terminal of the second impedance matching circuit and an input terminal of the power conversion circuit and an output power in an output terminal of the power conversion circuit and detect a frequency between the output terminal of the second impedance matching circuit and the input terminal of the power conversion circuit.

According to various embodiments, the instructions may be configured to cause the at least one processor to compare the input power and the output power and store a learning result that matches an impedance value causing maximum power of a power signal output from the impedance matching circuit with the detected frequency on the basis of the comparison result.

Figure 3A:
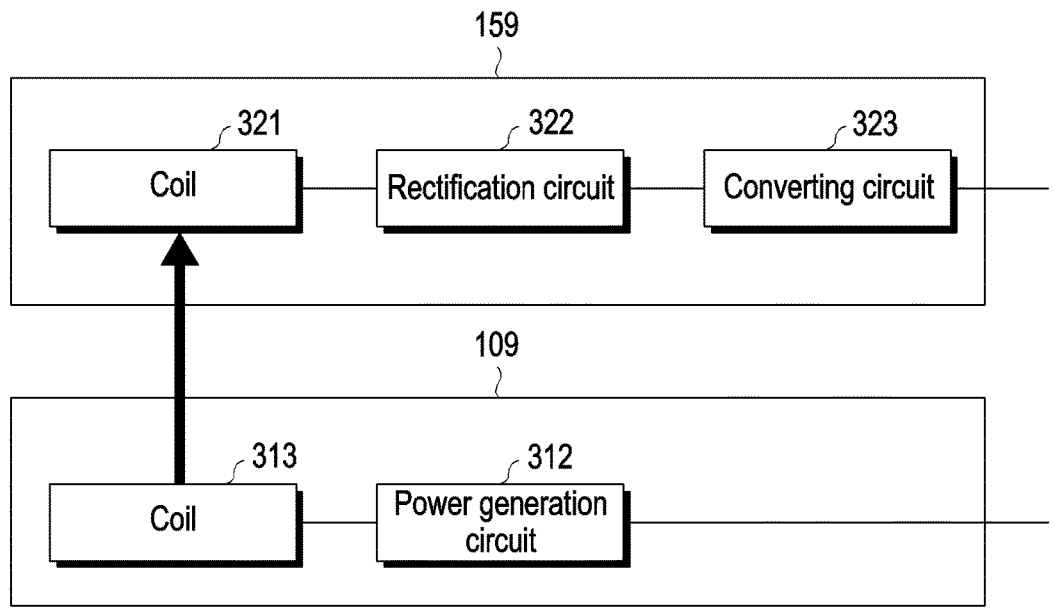
FIG. 3A is a block diagram illustrating a power transmission circuit and a power reception circuit based on an induction scheme or a resonance scheme according to various embodiments.

FIG. 3A is a block diagram illustrating an example power transmission circuit and a power reception circuit based on an induction scheme or a resonance scheme according to various embodiments.

According to various embodiments, the power transmission circuit 109 may include a power generation circuit 312 and a coil 313. The power generation circuit 312 may first rectify AC power received from the outside, invert the rectified power, and provide the power to the coil. Through the inverting operation, a maximum voltage or a value of 0 may be alternately applied to the coil 313 according to a preset period, and accordingly a magnetic field may be generated from the coil 313. An inverting frequency, for example, a frequency in an AC waveform applied to the coil 313, may be configured, for example, as 100 to 205 kHz or 6.78 MHz, and the like according to the standard, but there is no limitation thereto. When power is applied to the coil 313, an induced magnetic field, of which the magnitude is changed according to the time, may be formed by the coil 313, and accordingly power may be wirelessly transmitted. Although not illustrated, capacitors configuring the resonance circuit with the coil 313 may be further included in the power transmission circuit 109. In the coil 321 of the power reception circuit 159, an induced electromotive force may be generated by the magnetic field formed therearound of which the magnitude is changed according to the time, and accordingly the power reception circuit 159 may wirelessly receive power. The rectification circuit 322 may rectify the received AC waveform power. A converting circuit 323 may adjust a voltage of the rectified power and transfer the voltage to hardware. The power reception circuit 159 may further include a regulator, or the converting circuit 323 may be replaced with the regulator.

Figure 3B:
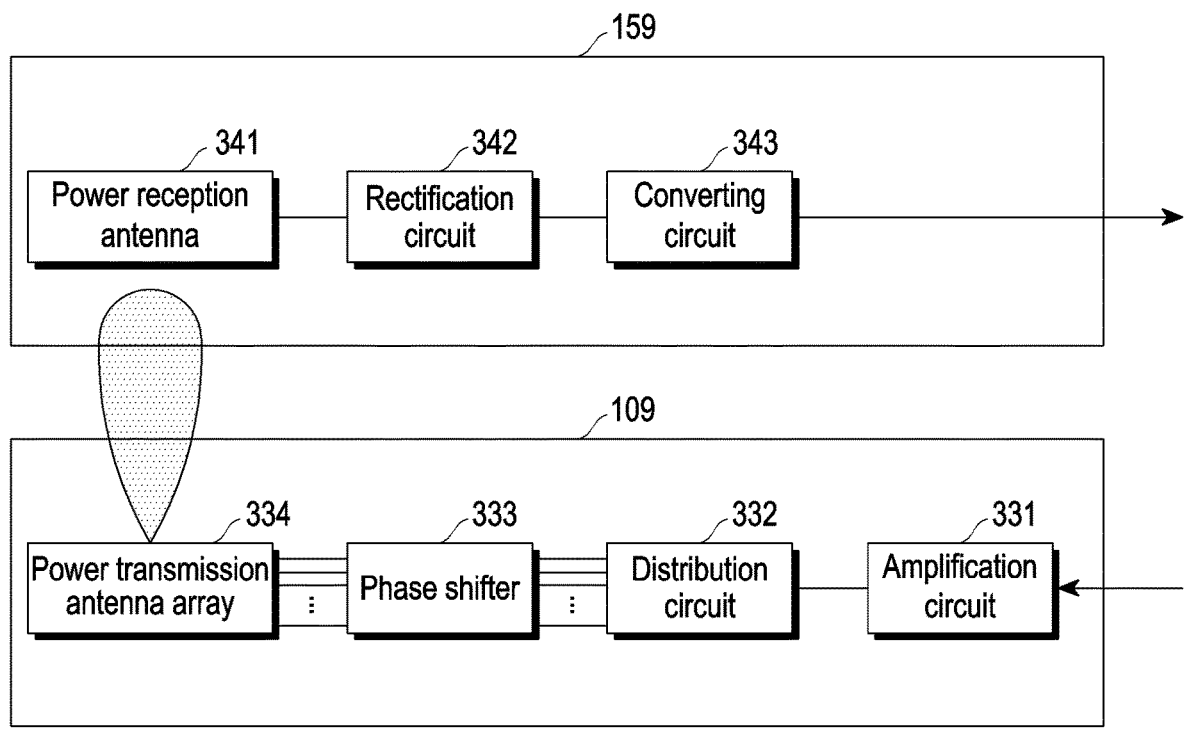
FIG. 3B is a block diagram illustrating a power transmission circuit and a power reception circuit based on an electromagnetic scheme according to various embodiments.

FIG. 3B is a block diagram illustrating an example power transmission circuit and a power reception circuit based on an electromagnetic scheme according to various embodiments. According to various embodiments, the power transmission circuit 109 may include an amplification circuit 331, a distribution circuit 332, a phase shifter (e.g., including phase shifting circuitry) 333, and a power transmission antenna array 334. In various embodiments, the power reception circuit 159 may include a power reception antenna 341, a rectification circuit 342, and a converting circuit 343.

The amplification circuit 331 may amplify power received from the power source 106 and provide the power to the distribution circuit 332. The amplification circuit 331 may be implemented as various amplifiers such as, for example, a Drive Amplifier (DA), a High Power Amplifier (HPA), a Gain Block Amplifier (GBA), and the like, or a combination thereof, but there is no limitation as to an implementation example thereof. The distribution circuit 332 may distribute power output from the amplification circuit 331 to a plurality of paths. Any circuit capable of distributing input power or signal to a plurality of paths can be the distribution circuit 332. For example, the distribution circuit 332 may distribute power to paths corresponding to the number of patch antennas included in the power transmission antenna array 334. The phase shifter 333 may include various phase shifting circuitry and shift a phase (or delay) of each of a plurality of AC powers provided from the distribution circuit 332. The number of phase shifters 333 may be plural, and may correspond to the number of patch antennas included in the power transmission antenna array 334. For example, and without limitation, a hardware element such as HMC642, HMC1113, or the like may be used as the phase shifter 333. Each shift degree by the phase shifter 333 may be controlled by the control circuit 102.

The control circuit 102 may determine the location of the electronic device 150 and shift a phase of each of a plurality of AC powers in order to allow RF waves to constructively interfere, for example, to be beamformed at the location of the electronic device 150 (or the location of the power reception antenna 341 of the electronic device 150). Each of the plurality of patch antennas included in the power transmission antenna array 334 may generate sub RF waves on the basis of received power. RF waves interfered by the sub RF waves may be converted to the current, voltage, or power by the power reception antenna 341 and then output. The power reception antenna 341 may include a plurality of patch antennas and generate the current, voltage, or power of the AC waveform using the RF waves formed therearound, that is, electromagnetic waves, which may be named received power. The rectification circuit 342 may rectify the received power in the DC waveform. The converting circuit 343 may increase or decrease a voltage of the power in the DC waveform to a preset value and output the same to the PMIC 158.

At least one of the power transmission circuit 109 or the power reception circuit 159 according to various embodiments may include all of a hardware device based on the induction scheme or the resonance scheme of FIG. 3A and a hardware device based on the electromagnetic scheme of FIG. 3B. In this case, the control circuit 102 or the control circuit 152 may select a charging scheme according to various conditions and control hardware corresponding to the selected charging scheme to be driven. The control circuit 102 or the control circuit 152 may use all of the induction scheme or the resonance scheme, and the electromagnetic scheme, and may drive all of the included hardware devices to transmit and receive power. The coil 321 for outputting AC power using a magnetic field therearound or the power reception antenna 341 for outputting AC power using RF waves therearound may be named a reception circuit.

According to various embodiments, the power reception circuit 159 of FIG. 2 may be implemented as the power reception circuit according to the induction scheme or the resonance scheme as illustrated in FIG. 3A or implemented as the power reception circuit according to the electromagnetic scheme as illustrated in FIG. 3B, and such a power reception circuit 159 may be referred to as an energy harvesting circuit (circuitry) (or an energy harvesting module). The energy harvesting circuit according to various embodiments may include at least one energy conversion module capable of converting energy therearound into electrical energy and include a module for various energy conversions such as the induction scheme, the resonance scheme, or the electromagnetic scheme, but it may be easily understood by those skilled in the art that there is no limitation as to the type of the energy conversion module.

The energy harvesting circuit may be applied to various electronic devices which need power, and impedance matching may be important to maximize efficiency of energy harvesting from various energy sources. In general, the impedance matching circuit is implemented as one matching end optimized for a single input, and the impedance matching is to apply maximum and/or improved power. The energy harvesting technology receives energy such as RF waves in the air, uses the energy as power of the electronic device, and thus secures energy without a separate energy supply, but may need each impedance matching end and an individual array antenna in order to secure energy of RF signals in various frequency bands and also it is cumbersome to manually control impedance matching one by one.

Hereinafter, an example embodiment of tracking an impedance matching value optimized for various energy sources, for example, input power in various frequency bands and changing the same using an automatically stored impedance matching value is described in greater detail below with reference to FIG. 4.

Figure 4:
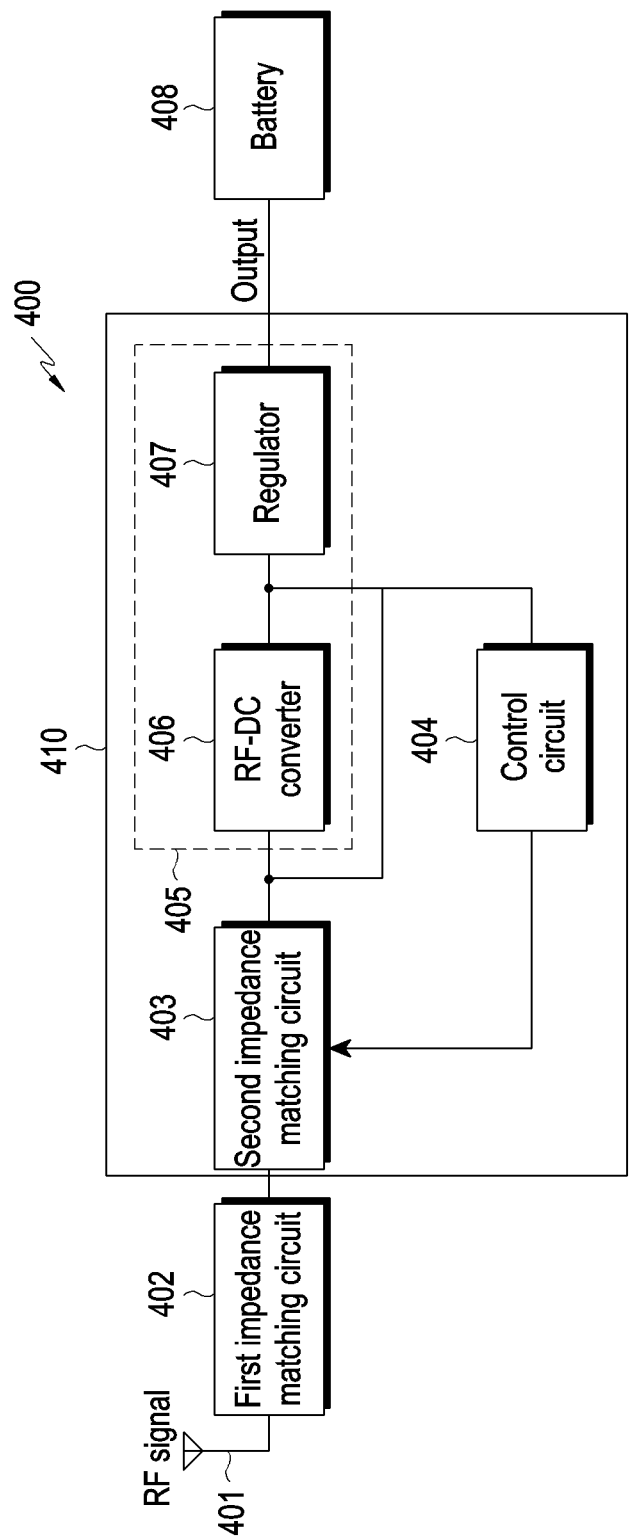
FIG. 4 is a block diagram illustrating an example electronic device for adaptive impedance matching according to various embodiments.

FIG. 4 is a block diagram illustrating an example electronic device for adaptive impedance matching according to various embodiments.

Referring to FIG. 4, an electronic device 400 (for example, the electronic device 150 of FIG. 1) may include an antenna 401, a first impedance matching circuit (circuitry) 402, a second impedance matching circuit 403, a control circuit 404, a power conversion circuit 405, and a battery 408.

According to various embodiments, a configuration including the second impedance matching circuit 403, the control circuit 404, and the power conversion circuit 405 may be referred to as an energy harvesting circuit 410. According to various embodiments, the energy harvesting circuit 410 may include at least one energy conversion module capable of converting energy therearound into electrical energy.

According to an embodiment, the second impedance matching circuit 403, the control circuit 404, and the power conversion circuit 405 may be independently included in the electronic device 400 or included in the electronic device 400 in the form of an Integrated Chip (IC).

The antenna 401 may be a power reception antenna circuit (wireless power antenna circuitry) and may output AC power using RF waves formed therearound. The antenna 401 may be connected to the first impedance matching circuit 402 to be operable. The antenna 401 may output the wirelessly received AC power to an input terminal of the first impedance matching circuit 402.

The first impedance matching circuit 402 may include at least one of at least one capacitor or at least one coil. The first impedance matching circuit 402 may perform impedance matching between the electronic device 400 and the wireless power transmission device 100. The first impedance matching circuit 402 may be configured to match impedance (or load) connected to the antenna 401. The first impedance matching circuit 402 may be a fixed impedance matching circuit connected to the antenna 401 to be operable. For example, the first impedance matching circuit 402 may be configured to match impedance (for example, 50Ω) of the wireless power transmission device 100 with the antenna 401. According to an embodiment, the first impedance matching circuit 402 may be referred to as a fixed impedance matching circuit. According to an embodiment, since impedance matching is performed by the second impedance matching circuit 403, the first impedance matching circuit 402 may be omitted. However, when the environment is changed according to the lapse of time, impedance matching efficiency through fixed impedance matching may be reduced. In order to compensate for the change, the adjustable second impedance matching circuit 403 may be used.

The second impedance matching circuit 403 may output a signal which is closest to input power, that is, a maximum power signal having no loss by outputting a signal which is more precisely adjusted for an input frequency, that is, an additional impedance matching signal. The control circuit 404 according to various embodiments may determine when and how to control impedance matching of the second impedance matching circuit 403. To this end, the control circuit 404 may control the second impedance matching circuit 403 for corresponding impedance on the basis of a frequency of a signal transmitted through the second impedance matching circuit 403 and the magnitude of power. Alternatively, the control circuit 404 may control the second impedance matching circuit 403 to perform specific impedance matching selected on the basis of the frequency of the signal transmitted through the antenna 401 or the first impedance matching circuit 402 and the magnitude of power of the signal transmitted through the second impedance matching circuit 403. Further, the control circuit 404 may control the second impedance matching circuit 403 with reference to not only the frequency of the signal transmitted through the second impedance matching circuit 403 and the magnitude of power but also the magnitude of power of a signal output from the power conversion circuit 405 or an RF-DC converter 406 of the power conversion circuit 405.

According to various embodiments, the control circuit 404 may determine when and how much the second impedance matching circuit 403 is adjusted using a matching network model. A control signal (or command) indicating which impedance matching of the second impedance matching circuit 403 is performed may be determined using a learning model learned through an artificial intelligence algorithm. The artificial intelligence algorithm may be referred to as an impedance matching network model, and the impedance matching network model may be a model learned using an algorithm technology for classifying/learning characteristics of detected power signals by itself such as machine learning.

Hereinafter, the case in which an output terminal of the first impedance matching circuit 402 is connected to an input terminal of the second impedance matching circuit 403 is described by way of example.

According to various embodiments, the energy harvesting circuit 410 may be configured to perform additional impedance matching in order to provide maximum efficiency for power received through the first impedance matching circuit 402.

To this end, the energy harvesting circuit 410 may include the second impedance matching circuit 403, the control circuit 404, and the power conversion circuit 405.

According to various embodiments, the second impedance matching circuit 403 may perform impedance matching for a power signal from the output terminal of the first impedance matching circuit 402. The second impedance matching circuit 403 may perform impedance matching to maximize power measured at the output terminal of the power conversion module 405 or the output terminal of the second impedance matching circuit 403. To this end, the second impedance matching circuit 403 may perform impedance matching using one of a plurality of impedance values for a power signal received from the first impedance matching circuit 402 under the control of the control circuit 404.

According to various embodiments, the second impedance matching circuit 403 may include a plurality of circuits corresponding to a plurality of impedance values. According to an embodiment, the plurality of circuits may include at least one capacitor and at least one switch, and the switch may switch a short circuit of the at least one capacitor. As the control circuit 404 controls a switching element of the second impedance matching circuit 403, the output terminal of the first impedance matching circuit 402 may be connected to one capacitor of the second impedance matching circuit 403 and an impedance matching power signal may be input into an input terminal of the power conversion module 405 through the connected capacitor.

As described above, the second impedance matching circuit 403 may include adaptive impedance matching elements having impedance values changed according to a control signal of the control circuit 404. According to an embodiment, the second impedance matching circuit 403 may be referred to as an adaptive impedance matching circuit. According to various embodiments, when impedance matching is primarily performed through the first impedance matching circuit 402, secondary impedance matching may be performed through the second impedance matching circuit 403 in order to output maximum and/or improved efficiency of the primarily impedance-matched power signal. At this time, the control of the second impedance matching circuit 403 may be performed by the control circuit 404, and the control circuit 404 may control the second impedance matching circuit 403 through an impedance matching configuration identified by an input frequency (or a reception frequency) and input power (or received power), thereby performing impedance matching having the maximum efficiency.

According to various embodiments, the energy harvesting circuit 410 may adjust an impedance matching value to obtain maximum power using an electrical characteristic of a source, for example, a frequency and the magnitude of power. According to various embodiments, even though the number of sources is plural and the sources have a multiconnection structure in which the sources are connected, impedance matching to obtain the maximum power can be performed.

According to various embodiments, the control circuit 404 may sequentially acquire the magnitude of power and a frequency of a power signal output from the second impedance matching circuit 403, compare powers of second impedance-matched power signals, identify a maximum power signal among the second impedance-matched power signals on the basis of the comparison result, and update an impedance value corresponding to the maximum power signal to an impedance value learned for the detected frequency. Accordingly, the control circuit 404 may output a control signal that allows the impedance value corresponding to the maximum power signal among a plurality of impedance values of the second impedance matching circuit 403, which can be combined, to be the impedance value of the second impedance matching circuit 403.

Further, when the impedance matching network model is learned, the control circuit 404 may use power signals output through the power conversion module 405 as well as power signals output from the second impedance matching circuit 403. For example, power magnitudes and frequencies of power signals output from the second impedance matching circuit 403 and power signals output through the power conversion module 405 may be compared each other, and a control signal for controlling the second impedance matching circuit 403 using an impedance matching network model on the basis of the comparison result may be output. According to an embodiment, the control circuit 404 may control on/off of at least one switch within the second impedance matching circuit 403 by a control signal, output maximum power through impedance matching changed by the control signal, and charge the battery 408 with the maximum power.

According to an embodiment, the control circuit 404 may correspond to the control circuit 152 of FIG. 2 for controlling the overall operation of the electronic device 400. The control circuit 404 may be a control circuit implemented for the purpose of controlling only the second impedance matching circuit 403. For example, the control circuit 404 may control an on/off state of each or a combination of at least one switching element within the second impedance matching circuit 403.

According to various embodiments, the change in the impedance matching value corresponding to the frequency of received power and detected power may be performed by a control circuit in real time on the basis of an adjustable impedance matching network model. The control circuit 404 may adjust the second impedance matching circuit 403 in real time on the basis of how impedance matching is performed through the second impedance matching circuit 403.

According to various embodiments, the control circuit 404 may perform control to make the change to the learned impedance matching value in real time in accordance with the frequency of received power and detected power. According to an embodiment, when the change (variation) in at least one of the frequency of received power and the magnitude of power is detected, the impedance matching value may be controlled to be changed to the learned impedance matching value corresponding to the detected power and frequency. The control circuit 404 may continuously monitor the frequency of received power and the power when there is no change (variation) in at least one of the frequency of received power and the magnitude of power rather than changing the impedance matching value whenever the frequency of received power and the power are detected, and may not output a control signal for changing the impedance value to the second impedance matching circuit 403 during the continuous monitoring.

According to an embodiment, when the detected change in the frequency is larger than or equal to a frequency threshold or when the detected change in the power is larger than or equal to a power threshold, a control signal for changing the impedance value may be output to the second impedance matching circuit 403. For example, when the frequency is changed or output power, that is, detected power is reduced by a threshold or more, the control circuit 404 may change the impedance value to a default value and then perform again the operation of detecting the output frequency and power of the second impedance matching circuit 403. Subsequently, the control circuit 404 may load an impedance value which may cause maximum power in accordance with the output frequency and power detected after the change to the default value and control the second impedance matching circuit 403 to perform impedance matching with the loaded impedance value.

According to various embodiments, the control circuit 404 may control the second impedance matching circuit 403 through the adjustable impedance matching network model and thus reduce a time spent for finding the impedance matching value, thereby implementing a fast energy harvesting system having the maximum efficiency.

According to various embodiments, the power conversion circuit 405 may convert the received power signal into charging power of the battery (or load) 408. The power conversion circuit 405 may include at least one of the RF-DC converter 406 and the regulator 407.

According to various embodiments, the power signal output through impedance matching by the second impedance matching circuit 403 is a signal in the AC form, and thus the power conversion circuit 405 may include the RF-DC converter 406 configured to rectify the AC signal to DC power by the output voltage. As described above, the RF-DC converter 406 may convert the AC power to the DC form and may be replaced with a regulator for primarily rectifying AC power. The RF-DC converter 406 may include elements such as, for example, and without limitation, a partial or complete regulator, a bridge, and a switching converter. Further, the power conversion circuit 405 may include the regulator 407 configured to convert the rectified power signal into an energy potential (for example, voltage) compatible with the battery 408, and the regulator 407 may be replaced with a DC-DC converter. The regulator 407 may serve to secondarily rectify the DC power primarily rectified by the RF-DC converter 406. For example, the regulator 407 may convert the voltage of the rectified DC power to a desired level and output the voltage and, when the voltage value of the rectified DC power is larger or smaller than a voltage value desired for charging the battery 408 or driving the electronic device 400, change the voltage of the rectified DC power into a desired voltage.

The battery 408 may be connected to the energy harvesting circuit 410 to be operable. The battery 408 may store energy using power output from the regulator 407. Although FIG. 4 illustrates the battery 408, a driving circuit or load for performing various operations of the load or the electronic device 400 may be included instead of the battery 408.

According to various embodiments, the electronic device 400 may include a first impedance matching circuit 402 configured to perform first impedance matching on a power signal wirelessly received from a wireless power transmission device 100, a second impedance matching circuit 403 configured to perform second impedance matching on the first impedance-matched power signal using one of a plurality of impedance values, a control circuit 404 configured to perform control to change an impedance value of the second impedance matching circuit to an impedance value learned using an impedance matching network model in accordance with a power and a frequency of the second impedance-matched power signal, and a power conversion circuit 405 configured to convert the second impedance-matched power signal in an AC form into a power in a DC form for a battery according to the changed impedance value.

According to various embodiments, the impedance matching network model may be configured to sequentially acquire second impedance-matched power signals using the plurality of impedance values, identify a maximum power signal among the second impedance-matched power signals on the basis of a comparison between powers of the second impedance-matched power signals, and change the impedance value of the second impedance matching circuit to the learned impedance value, which is an impedance value corresponding to the maximum power signal, among the plurality of impedance values.

According to various embodiments, the second impedance matching circuit 403 may include a plurality of circuits corresponding to the plurality of respective impedance values, and the plurality of circuits may include at least one capacitor and at least one switch configured to switch a short circuit of the at least one capacitor.

According to various embodiments, the impedance value learned using the impedance matching network model may include an impedance value causing a maximum power of another power signal for a detected frequency among the plurality of impedance values on the basis of detection of a power and the frequency of the another power signal output from the second impedance matching circuit 403.

According to various embodiments, the control circuit 404 may be configured to perform control to detect power and a frequency of the second impedance-matched power signal in an input terminal of the power conversion circuit 405, identify an impedance value corresponding to the detected power and frequency using the impedance matching network mode, and change the impedance value of the second impedance matching circuit 403 to the identified impedance value.

According to various embodiments, the control circuit 404 may include a power detection circuit configured to detect an input power between an output terminal of the second impedance matching circuit 403 and an input terminal of the power conversion circuit 405 and an output power in an output terminal of the power conversion circuit 405, and a frequency detection circuit configured to detect a frequency between the output terminal of the second impedance matching circuit 403 and the input terminal of the power conversion circuit.

According to various embodiments, the control circuit 404 may be configured to compare the input power and the output power and update a learning result learned to match an impedance value causing a maximum power of a power signal output from the second impedance matching circuit 403 to the detected frequency on the basis of the comparison result.

According to various embodiments, the power conversion circuit 405 may include an RF-DC converter 406 configured to convert a second impedance-matched power signal in an AC form to a DC form according to the changed impedance value.

According to various embodiments, the power conversion circuit 405 may further include a regulator 407 configured to rectify the power signal in the DC form output from the RF-DC converter 406 to a voltage for the battery.

Figure 5:
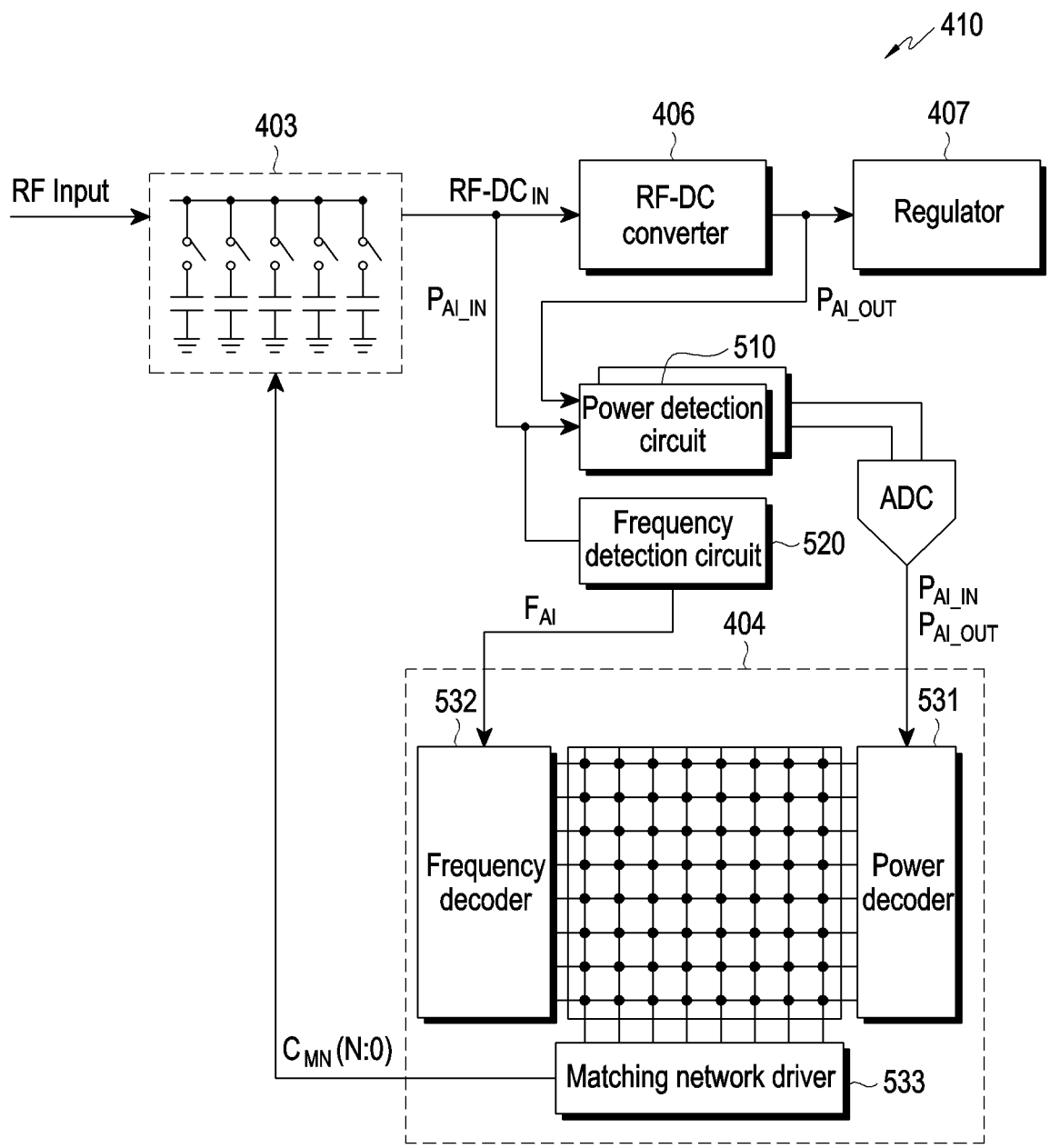
FIG. 5 is a block diagram illustrating an example energy harvesting circuit according to various embodiments.

FIG. 5 is a block diagram illustrating an example configuration of an energy harvesting circuit according to various embodiments.

Referring to FIG. 5, the energy harvesting circuit 410 may include the second impedance matching circuit 403, the control circuit 404, and the RF-DC converter 406. Further, the energy harvesting circuit 410 may include a power detection circuit 510 and a frequency detection circuit 520, and may further include the regulator 407 for converting a voltage required for charging the battery 408. The power detection circuit 510 and the frequency detection circuit 520 may be implemented as one detector (or detection module).

According to various embodiments, an RF input may be transferred to the second impedance matching circuit 403. For example, the RF input may be a fixed impedance value for a power signal wirelessly received from the wireless power transmission device and may be an impedance-matched power signal. Accordingly, the primarily impedance-matched power signal may be input into the second impedance matching circuit 403.

According to various embodiments, the power signal impedance-matched through the second impedance matching circuit 403 is a power signal in the AC form (for example, RF-DCIN) and may be input into an input terminal of the RF-DC converter 406. The input terminal of the RF-DC converter 406 may be connected to an output terminal of the second impedance matching circuit 403, and an input terminal of the regulator 407 may be connected to an output terminal of the RF-DC converter 406. Accordingly, the impedance-matched power signal in the AC form from the output terminal of the RF-DC converter 406 may be converted into a power signal in the DC form and input into the input terminal of the regulator 407, and the regulator 407 may rectify the power signal in the DC form to charging power (for example, voltage) for the battery 408 and output the same. For example, in the energy harvesting circuit 410, the regulator 407 may be directly connected to the RF-DC converter 406 for performing conversion to electrical energy. Alternatively, a DC-DC converter may be directly connected to the RF-DC converter 406 instead of the regulator 407. The regulator 407 or the DC-DC converter may convert electrical energy received from the RF-DC converter 406, for example, a voltage of the power in the DC form into a voltage required for charging the battery 408.

As illustrated in FIG. 5, the second impedance matching circuit 403 may include at least one capacitor and at least one switching element. For example, when a first switching element is in an on state, impedance matching may be performed using a first capacitor connected to the first switching element. When a second switching element is in an on state, impedance matching may be performed using a second capacitor connected to the second switching element. When the second switching element is in an on state, impedance matching may be performed using a third capacitor connected to the third switching element. As described above, the impedance value may be changed by turning on or off each switching element, but the impedance value may be changed by controlling on/off of a combination of a plurality of switching elements. A combination of a plurality of switching elements which can be connected will be described in greater detail below with reference to FIG. 6.

As described above, it is possible to acquire and use higher efficiency power through impedance matching according to an input frequency and input power using a plurality of capacitors and switching elements between the power reception antenna and the power conversion circuit as the adaptive impedance matching circuit.

In this case, the second impedance matching circuit 403 may output power having the magnitude of A through impedance matching by the connection of the first switching element, and when the power having the magnitude of A is compared with power of the output terminal of the RF-DC converter 406, efficiency may be a. The efficiency a may be a ratio of the magnitude of input power (for example, $P_{AI\_IN}$) to the magnitude of output power (for example, $P_{AI\_OUT}$). Further, the second impedance matching circuit 403 may output power having the magnitude of B through impedance matching by the connection of the second switching element, efficiency may be b when the power having the magnitude of B is compared with power of the output terminal of the RF-DC converter 406, and efficiency may be c when power having the magnitude of C is output.

When power having the relatively stable magnitude is provided, the second impedance matching circuit 403 may perform impedance matching with relatively high efficiency. However, in an environment in which the magnitude of the input power or the frequency is changed, impedance matching may be performed with relatively low efficiency according to the change in efficiency by impedance matching of the second impedance matching circuit 403, but impedance matching with maximum efficiency may be performed according to various embodiments even through the magnitude of the input power or the frequency is changed. To this end, the control circuit 404 may control in real time the second impedance matching circuit 403 to change the impedance value into the impedance value corresponding to the changed frequency on the basis of matching information learned for correlation of the impedance value which may cause maximum power in accordance with each frequency. As described above, the control circuit 404 may transfer a control signal for controlling the second impedance matching circuit 403 to the second impedance matching circuit 403 on the basis of matching information learned using the impedance matching network model.

According to various embodiments, the energy harvesting circuit 410 may include the power detection circuit 510 for detecting power of the output terminal of the second impedance matching circuit 403 and the frequency detection circuit 520 for detecting the frequency of the output terminal of the second impedance matching circuit 403. Although FIG. 4 illustrates that the control circuit 404 detects the power and the frequency in the output terminal of the second impedance matching circuit 403, the power detection circuit 510 and the frequency detection circuit 520 may be separately configured between the second impedance matching circuit 403 and the control circuit 404 independently from the control circuit 404.

According to various embodiments, the power detection circuit 510 may detect the magnitude of power between the output terminal of the second impedance matching circuit 403 and the input terminal of the RF-DC converter 406. Further, the power detection circuit 510 may detect the magnitude of power (for example, $P_{AI\_OUT}$) in the output terminal of the RF-DC converter 406.

For example, the power detection circuit 510 may include a voltmeter capable of detecting the magnitude of the voltage (for example, $P_{AI\_IN}$) applied to the input terminal of the RF-DC converter 406 and the magnitude of the voltage (for example, $P_{AI\_OUT}$) in the output terminal of the RF-DC converter 406, and the power detection circuit 510 may be implemented in various forms. Accordingly, information on the magnitude of the power, for example, the voltage detected by the power detection circuit 510 may be provided to the control circuit 404. For example, the power detection circuit 510 may serve to find a value which may cause maximum power for the detected frequency (or input frequency) using a circuit for detecting a peak such as a peak detection circuit.

According to various embodiments, the frequency detection circuit 520 may detect the frequency (for example, $F_{AI}$) between the output terminal of the second impedance matching circuit 403 and the input terminal of the RF-DC converter 406. For example, in the case of an RF input, the frequency is fast because of a frequency characteristic, and thus the frequency detection circuit 520 may divide the frequency through a 1/N divider and detect a frequency value. For example, the frequency detection circuit 520 may detect how many GHz the input frequency is.

According to various embodiments, the control circuit 404 may be implemented using a Static Random-Access Memory (SRAM) array. For example, the control circuit 404 may be implemented using a 6T SRAM Cell. The control circuit 404 may include a power decoder 531 for decoding the magnitude of the voltage (for example, $P_{AI\_INT}$) applied to the input terminal of the RF-DC converter 406 and the magnitude of the voltage (for example, $P_{AI\_OUT}$) in the output terminal of the RF-DC converter 406, detected by the power detection circuit 510, and a frequency decoder 532 for decoding the frequency (for example, $F_{AI}$) between the output terminal of the second impedance matching circuit 403 and the input terminal of the RF-DC converter 406. The power decoder 531 may decode power information (for example, $P_{AI\_IN}$) in the input terminal of the RF-DC converter 406 in units determined per second in the detected frequency. Further, the power decoder 531 may decode power information (for example, $P_{AI\_OUT}$) in the output terminal of the RF-DC converter 406 in units determined per second in the detected frequency. In addition, the frequency decoder 532 also may decode the detected frequency in units determined per second.

When learning for the impedance matching network model is completed, for example, when the magnitudes of power and the frequencies for power signals sequentially collected for all impedance combinations of the second impedance matching circuit 403 are detected and compared, and learning for the impedance value which may cause maximum power among the power signals is completed on the basis of the comparison result, a matching network driver 533 of the control circuit 404 may transfer a control signal (for example, $C_{MN}$) for changing the impedance value of the second impedance matching circuit 403 to the learned impedance value corresponding to the detected frequency (for example, $F_{AI}$) to the second impedance matching circuit 403.

When learning for the impedance matching network model is not completed, in order to find the impedance value which may cause the maximum power in accordance with the detected frequency (for example, $F_{AI}$), the control circuit 404 may perform control to sequentially detect power and frequencies for all combinations of the second impedance matching circuit 403. The control circuit 404 may perform control to selectively change impedance values of the second impedance matching circuit 403 in order to obtain the maximum output power during a learning mode.

When the 6T SRAM Cell is used, the control circuit 404 operating as described above may be implemented as illustrated in FIG. 6.

Figure 6:
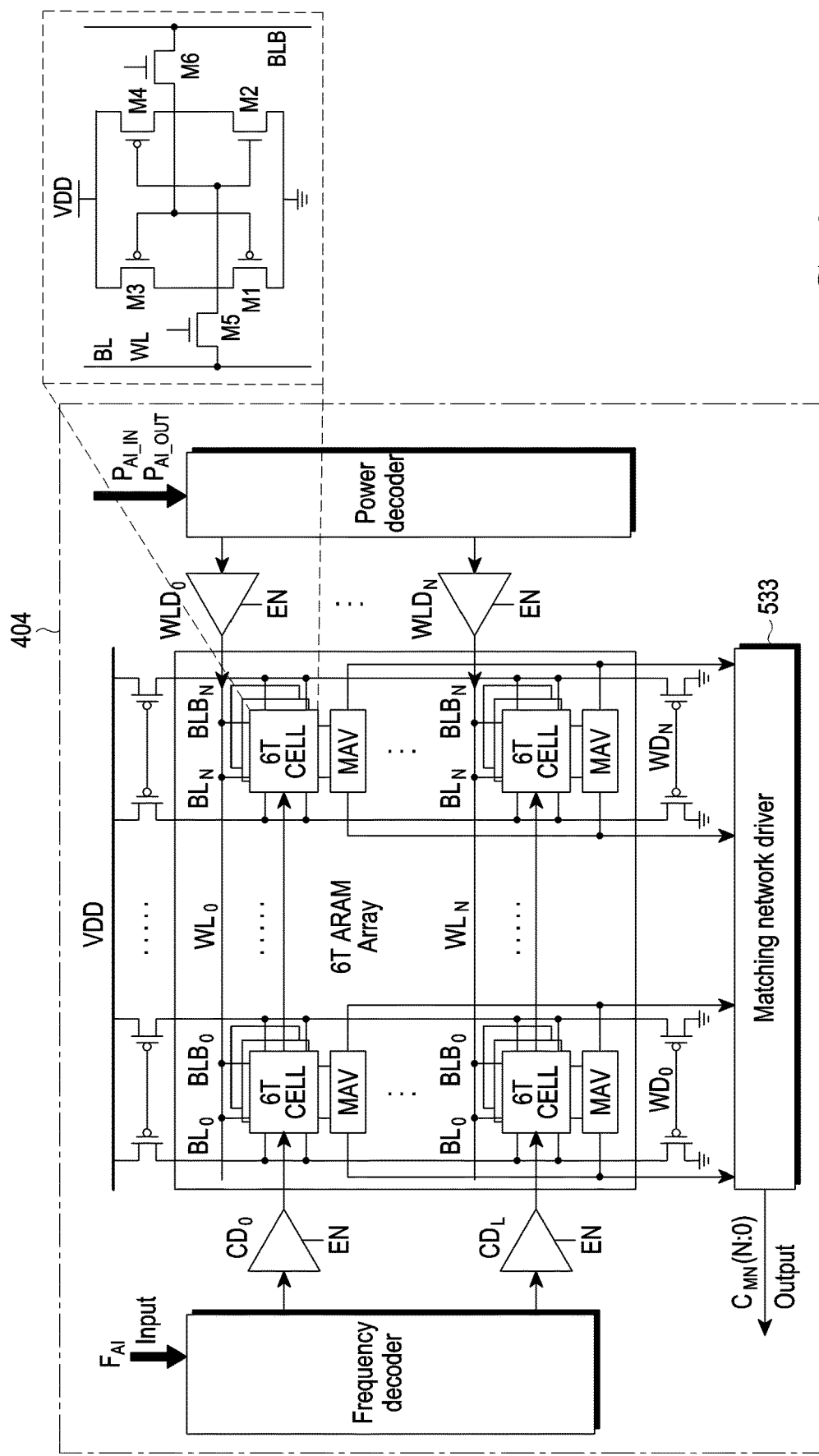
FIG. 6 is a block diagram illustrating an example control circuit according to various embodiments.

FIG. 6 is a block diagram illustrating the control circuit 404 according to various embodiments.

Referring to FIG. 6, various switching combinations in the second impedance matching circuit 403 may be stored in the mapping form for the frequency using each memory cell (for example, 6T CELL), and the matching network driver 533 may find the impedance value which may cause the maximum power at a fast speed in accordance with the input frequency (or detected frequency).

For example, the control circuit 404 may acquire information on the frequency detected by the frequency detection circuit 520 for the input RF input. There may be no impedance matching value pre-stored for the detected frequency (for example, frequency #1) at the beginning of learning, and thus the second impedance matching circuit 403 may be set to an initial state (for example, N=0) to find the impedance matching value which may cause the maximum power and then the operation of detecting the magnitude of the power for the power signal through the power detection circuit 510 may be performed. To this end, control signal #0 (for example $C_{MN}(0)$) may be transferred to the second impedance matching circuit 403, and the magnitude of power and the frequency for power signal #0 in the output terminal of the second impedance matching circuit 403 may be performed in accordance with control signal #0 (for example, $C_{MN}(0)$). Accordingly, the magnitude of power for power signal #0 output through the power detection circuit 510 may be detected. Subsequently, the next control signal, for example, control signal #1 (for example, $C_{MN}(1)$) may be transferred to the second impedance matching circuit 403, and the magnitude of power and the frequency for power signal #1 in the output terminal of the second impedance matching circuit 403 may be detected in accordance with control signal #1 (for example, $C_{MN}(1)$).

Through the sequential scheme as described above, the last control signal, for example, control signal #N (for example, $C_{MN}(N)$) may be transferred to the second impedance matching circuit 403, and the magnitude of power and the frequency for power signal #N in the output terminal of the second impedance matching circuit 403 may be detected in accordance with control signal #N (for example, $C_{MN}(N)$).

As described above, when the operation of detecting the magnitude of power and the frequency is completed sequentially N+1 times (for example, 0 to N) for N switching combinations, a control signal which draws a power signal having the maximum power among power signals #0 to #N in accordance with the detected frequency may be stored as matching information corresponding to the detected frequency. For example, among all power signals, for example, power signal #0 to power signal #N, the maximum power signal may be identified, and a learning result having the impedance value which allows the maximum power signal among the plurality of impedance values to be output as the learned impedance value may be updated. The control signal may be a signal for controlling on/off of at least one switch of the second impedance matching circuit 403 and a combination of the switches to perform impedance matching with one of a plurality of impedance values. Accordingly, when there is matching information corresponding to the detected frequency, the control circuit 404 may provide the control signal (for example, $C_{MN}(N)$) corresponding to the matching information to the second impedance matching circuit 403, so that the second impedance matching circuit 403 may perform impedance matching for the next power signal with the impedance value changed according to the matching information. Therefore, the power signal having the maximum magnitude may be output from the output terminal of the second impedance matching circuit 403.

As described above, when the impedance value which allows the power signal having the maximum power to be output is acquired among the plurality of power signals #0 to #N, the learning result may be updated to correlate the control signal (for example, $C_{MN}(i)$) corresponding to the impedance value with the detected frequency (for example, frequency #1). Further, in the learning mode, with respect to another frequency (for example, frequency #2), the learning result may be updated to correlate the control signal (for example, $C_{MN}(j)$) corresponding to the impedance value for allowing the power signal having the maximum power to be output with the other frequency (for example, frequency #2). In such a way, it is possible to update the learning result to match the impedance value which may cause the maximum power with each frequency by repeating the same procedure while changing the configuration of the second impedance matching circuit 403 for each of a plurality of frequencies.

Figure 7A:
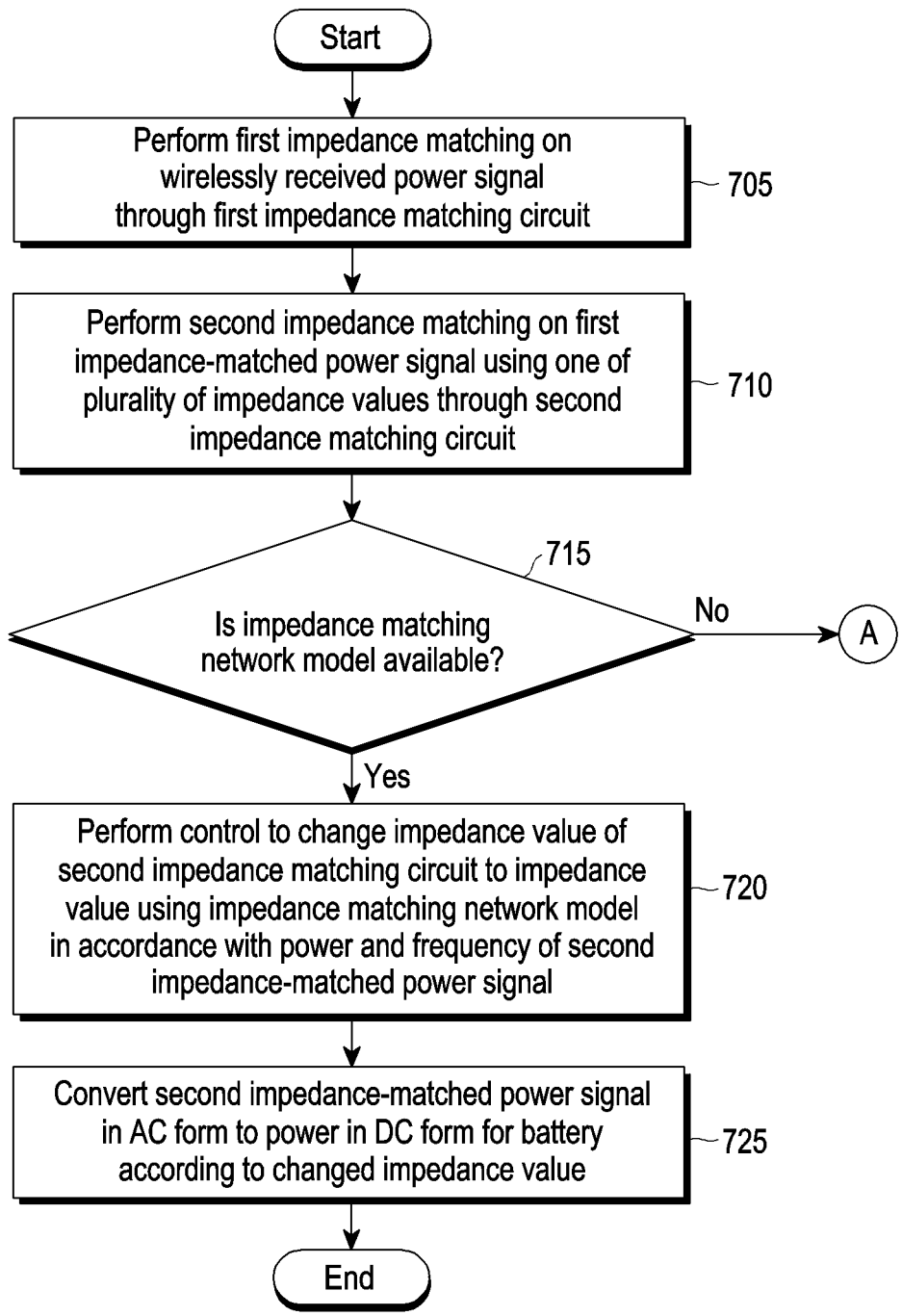
FIG. 7A is a flowchart illustrating an example operation of an electronic device in an operation mode according to various embodiments.

FIG. 7A is a flowchart illustrating an example operation of an electronic device in an operation mode according to various embodiments. FIG. 7A illustrates the operation for performing an adaptive impedance matching method, and the operation method may include operations 705 to 725. Each step/operation in the operation method may be performed by at least one of the electronic devices (for example, the electronic device 150 of FIGS. 1 and 2) or at least one processor of the electronic device (for example, the control circuit 152 of FIG. 1 and the control circuit 404 of FIG. 4). In an embodiment, at least one of operations 705 to 725 may be omitted, the sequence of some operations may be changed, or other operations may be added.

Hereinafter, the operation of the electronic device 400 is described by way of example.

In operation 705, for the wirelessly received power signal, the electronic device 400 may perform first impedance matching through the first impedance matching circuit 402.

In operation 710, for the first impedance-matched power signal, the electronic device 400 may perform second impedance matching through the second impedance matching circuit 403 using one of a plurality of impedance values. The second impedance matching circuit 403 may include a plurality of circuits corresponding to the plurality of impedance values, and the plurality of circuits may include at least one capacitor and at least one switching element. When initial charging starts (or when wireless power is received), at least one capacitor may be connected to the output terminal of the first impedance matching circuit 402 and the input terminal of the power conversion circuit 405 (for example, RF-CD converter 406) by the default value.

In operation 715, the electronic device 400 may determine whether the impedance matching network model is available. When the impedance matching network model is available, the electronic device 400 may perform control to change the impedance value of the second impedance matching circuit 403 into an impedance value learned using the impedance matching network model in accordance with power and the frequency of the second impedance-matched power signal in operation 720.

According to an embodiment, the impedance matching network model may be configured to sequentially acquire second impedance-matched power signals using the plurality of impedance values, identify a maximum power signal among the second impedance-matched power signals on the basis of comparison between powers of the second impedance-matched power signals, and change an impedance value of the second impedance matching circuit to the learned impedance value which is an impedance value corresponding to the maximum power signal among the plurality of impedance values.

According to an embodiment, on the basis of detection of power and a frequency of another power signal output from the second impedance matching circuit, the impedance value learned using the impedance matching network model may include an impedance value causing maximum power of the other power signal for the detected frequency among the plurality of impedance values. In order to know values of the power and the frequency of the second impedance-matched power signal, detection for the magnitude of the power and a frequency value (or a frequency channel) may be performed by a power detection circuit or a frequency detection circuit. According to an embodiment, an input power between the output terminal of the second impedance matching circuit 403 and the input terminal of the power conversion circuit 405 and an output power in the output terminal of the power conversion circuit 405 may be detected. According to an embodiment, a frequency between the output terminal of the second impedance matching circuit 403 and the input terminal of the power conversion circuit 405 may be detected.

When the impedance matching network model is available, the electronic device 400 may perform control to change the impedance value of the second impedance matching circuit 403 to the impedance value using the impedance matching network model in accordance with the power and the frequency of the second impedance-matched power signal in operation 720. The operation of changing the impedance value of the second impedance matching circuit 403 may include an operation of controlling at least one switch for switching a short circuit of at least one capacitor included in the second impedance matching circuit 403. For example, when matching information (for example, $C_{MN}(N)$) is stored as matching information corresponding to the power (for example, $P_{AI\_IN}(N)$) and the frequency (for example, $F_{AI}(N)$) of the second impedance-matched power signal, the pre-stored matching information (for example, $C_{MN}(N)$) may correspond to the impedance matching value which may cause the maximum power for the frequency (for example, $F_{AI}(N)$). Accordingly, if the frequency 400 is aware of the frequency (for example, $F_{AI}(N)$) in the output terminal of the second impedance matching circuit 403, the electronic device 400 may identify how to change the impedance value of the second impedance matching circuit 403 in accordance with the frequency. Accordingly, if the impedance value of the second impedance matching circuit 403 is changed on the basis of the learned matching information (for example, $C_{MN}(N)$), a power signal having maximum power may be output from the output terminal of the second impedance matching circuit 403 thereafter.

In operation 725, the electronic device 400 may convert the second impedance-matched power signal in the AC form into power in the DC form for the battery 408 according to the changed impedance value. Since the impedance value for controlling the second impedance matching circuit 403 can be known at once on the basis of the learned matching information, maximum efficiency power, that is, maximum power through optimal impedance matching may be automatically acquired. Accordingly, the maximum efficiency power signal also may be output from the output terminal of the RF-DC converter 406, and it is possible to acquire maximum efficiency in conversion into charging power for the battery 408.

As described above, if the second impedance matching circuit 403 is continuously controlled to have the impedance value causing the maximum power, it is possible to accurately acquire maximum power at a high speed. According to various embodiments, in subsequent charging, the learned matching information may be loaded and used for impedance matching directly without an additional tracking operation for impedance matching in the case of an input frequency corresponding to frequency stored in accordance with matching information, and thus energy harvesting may be performed with maximum efficiency for input power in a wide range and a total system efficiency may increase. Further, matching information learned through an update is used, and thus a time spent for finding an impedance matching value for maximum efficiency may be reduced.

Figure 7B:
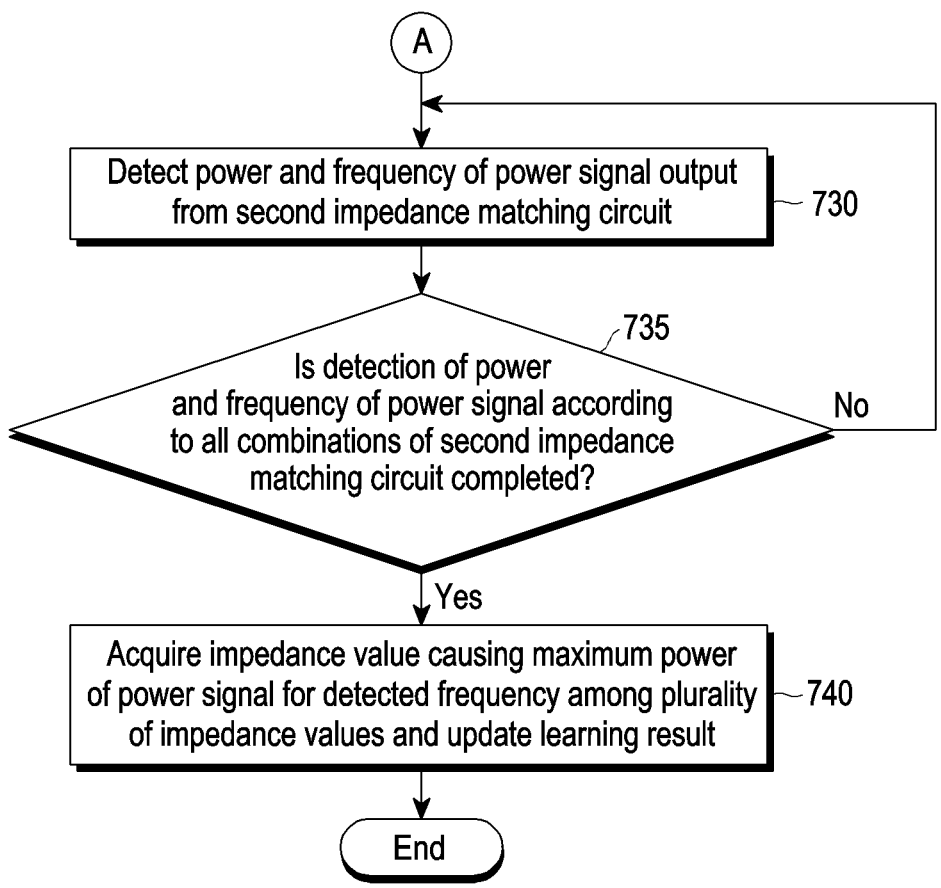
FIG. 7B is a flowchart illustrating an example operation of an electronic device in a learning mode according to various embodiments.

FIG. 7B is a flowchart illustrating example operation of an electronic device in a learning mode according to various embodiments. FIG. 7B is a drawing connected to FIG. 7A, and "A" may be used to indicate the connection relation between operation 715 of FIG. 7A and operation 730 of FIG. 7B. FIG. 7B illustrates an advance preparation operation for learning matching information on the basis of detection information from the second impedance matching circuit 403, for example, each of the frequency and the power magnitude, when the impedance matching network model is not available, and an operation method may include operations 730 to 740. Each step/operation of the operation method may be performed in the learning mode.

Referring to FIG. 7B, when the impedance matching network model is not available in operation 715 of FIG. 7A, for example, when there is no matching information learned using the impedance matching network model in accordance with the power and the frequency of the second impedance-matched power signal, the electronic device 400 may detect power and a frequency of a power signal output from the second impedance matching circuit in operation 730.

In operation 735, the electronic device 400 may determine whether detection of powers and frequencies of power signals according to all combinations of the second impedance matching circuit 403 is completed. For example, the operation of finding an impedance value which may cause maximum power among N combinations (or impedance values) of the second impedance matching circuit 403 may be repeatedly (or sequentially) performed for the detected frequencies and power magnitudes. As described above, the operation of monitoring values detected from output signals of the second impedance matching circuit 403, learning matching information corresponding to the detected frequencies and power magnitudes on the basis of the monitoring result, and updating the matching information to matching information causing maximum power may be referred to as an operation of learning the impedance matching network model.

In operation 740, the electronic device 400 may acquire an impedance value causing maximum power of the power signal for the detected frequency among the plurality of impedance values and update the learning result. Accordingly, the updated learning result may be stored. For example, power signals according to a plurality of impedance values may be detected for the detected frequency, and the impedance matching network model may be updated such that an impedance value when a power signal having maximum power appears among the power signals may be correlated to the detected frequency.

Figure 8:
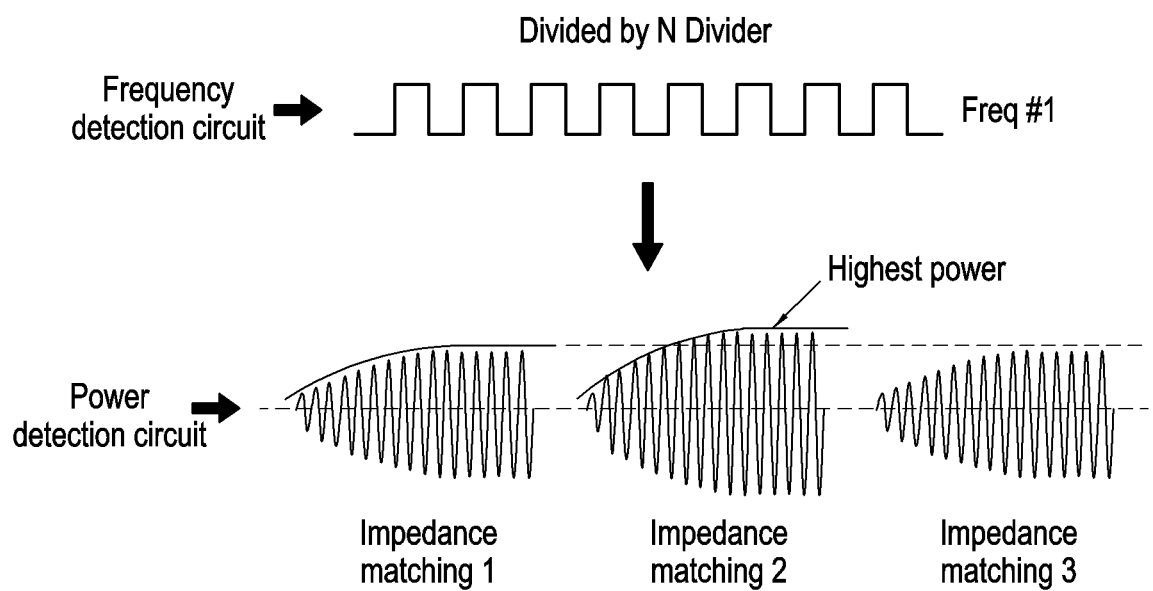
FIG. 8 is a diagram illustrating example operation of a power detection circuit and a frequency detection circuit according to various embodiments.

FIG. 8 is a diagram illustrating example operation of a power detection circuit and a frequency detection circuit according to various embodiments.

Referring to FIG. 8, since the frequency is high because of a frequency characteristic for an RF input, the frequency detection circuit 520 may divide the input frequency (for example, frequency #1 (Freq #1)) through a 1/N divider. In accordance with this, the power detection circuit 510 may detect powers having different magnitudes such as impedance matching value #1, impedance matching value #2, and impedance matching value #3 for frequency #1.

As illustrated in FIG. 8, in the case of impedance matching value #2 among impedance matching value #1, impedance matching value #2, and impedance matching value #3, power having the largest magnitude may be output. Accordingly, the learning result may be updated such that impedance matching value #2 generated when power having the largest magnitude among a plurality of powers detected by the power detection circuit 510 appears is correlated to matching information for frequency #1. As described above, the power detection circuit 510 may perform the operation of finding the impedance matching value making maximum power for the RF input appear. Accordingly, when the input frequency is received in the form of a frequency having the value of frequency #1, impedance matching value #2 stored in accordance with frequency #1 may be directly loaded and applied to control the second impedance matching circuit 403, and thus optimal impedance matching at a high speed can be performed without a complex tracking process. Power of the power signal from the output terminal of the RF-DC converter 406 may be continuously detected and compared with the power signal from the output terminal of the second impedance matching circuit 403. When the power signal has a difference larger than or equal to a threshold on the basis of the comparison with the power signal from the output terminal of the second impedance matching circuit 403, an error in the RF-DC converter 406 may be detected. Alternatively, when the power signal from the output terminal of the RF-DC converter 406 is continuously detected and there is a difference larger than or equal to a threshold, the operation for finding other matching information may be performed.

Figure 9:
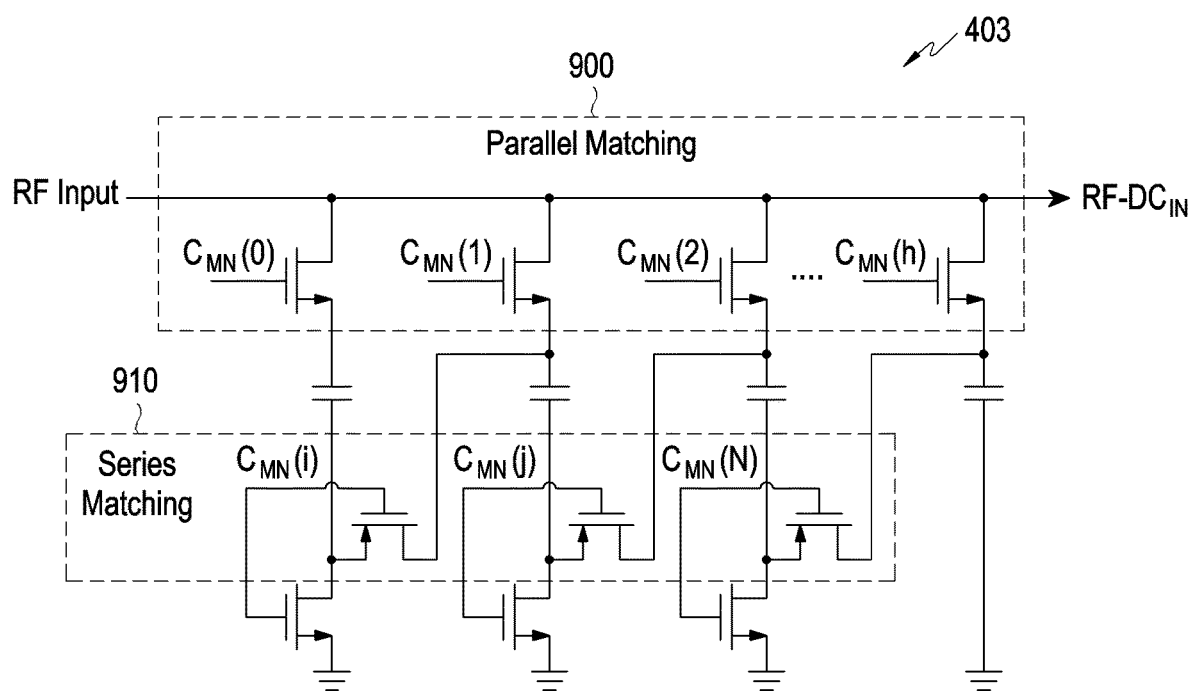
FIG. 9 is a circuit diagram illustrating an example configuration of an adaptive impedance matching circuit according to various embodiments.

FIG. 9 is a circuit diagram 403 illustrating an example configuration of an adaptive impedance matching circuit according to various embodiments.

According to various embodiments, the second impedance matching circuit 403 may include a plurality of circuits corresponding to a plurality of impedance values (for example, $C_{MN}(0), \ldots, C_{MN}(N)$) as illustrated in FIG. 9, and the plurality of circuits may be configured in parallel 900, in series 910, or by a combination thereof, and may be provided in other various forms. FIG. 9 illustrates a case in which capacitors are connected in series or in parallel, but is not limited thereto. For example, the second impedance matching circuit 403 may turn on/off at least some of the plurality of circuits in accordance with an impedance value according to a control signal of the control circuit 404.

According to various embodiments described above, impedance may be changed according to a change in a capacitance value of at least one capacitor within the second impedance matching circuit 403. Accordingly, through a change in the connection of a capacitance value of a capacitor through a switching element based on a control signal, adaptive RF signal matching can be performed without addition of a separate element.

Figure 10:
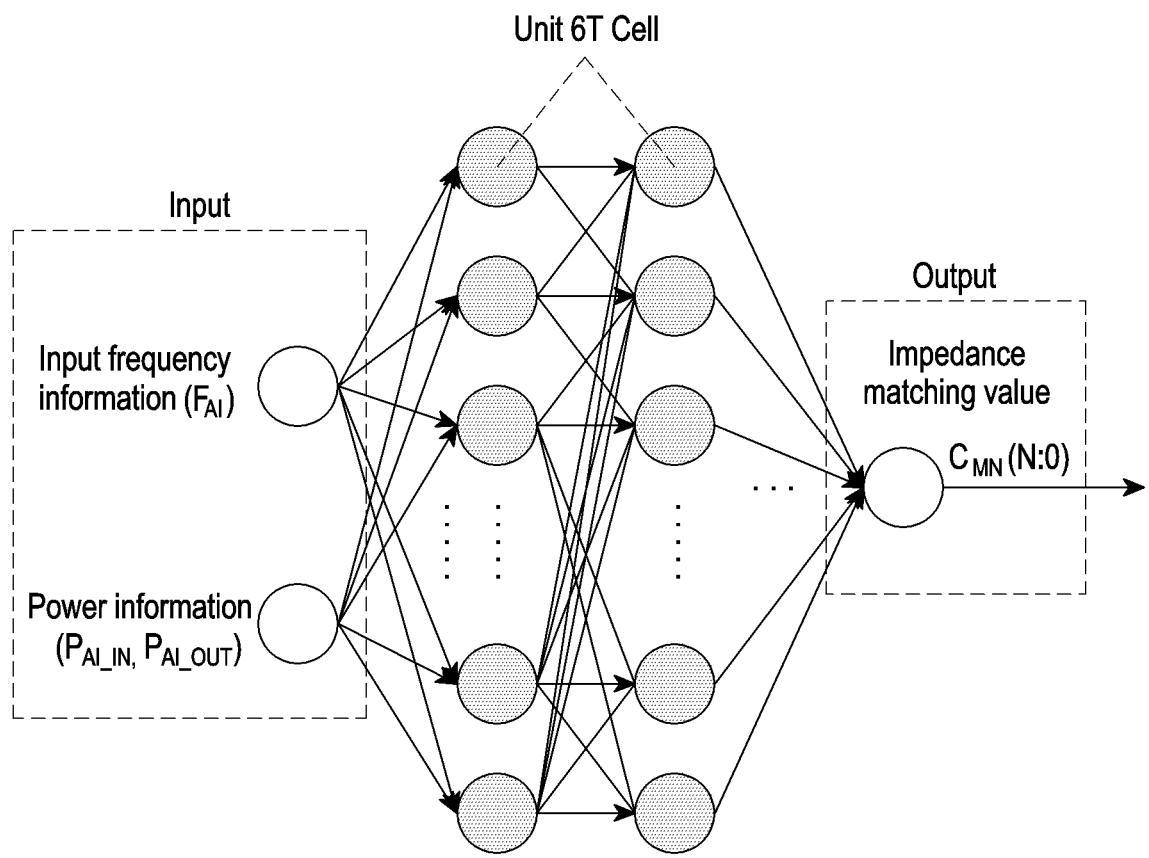
FIG. 10 is a diagram illustrating an example of switching combinations for adaptive impedance matching according to various embodiments.

FIG. 10 is a diagram illustrating an example of switching combinations for adaptive impedance matching according to various embodiments.

FIG. 10 illustrates an example of available combinations in the second impedance matching circuit 403. According to an embodiment, the control of adaptive impedance matching may be performed on the basis of a convolutional neural network. Since the convolutional neural network processes infinitely many combinations in parallel, a processing speed thereof may be 100 to 1000 times or more than the conventional series processing speed. Accordingly, the convolutional neural network scheme may be useful for rapidly finding an optimal value for various combinations which may be generated according to the series type, the parallel type, or a combination thereof for adaptive impedance matching. As described above, through the convolutional neural network scheme, input frequency information (for example, $F_{AI}$) and power information (for example, $P_{AI\_IN}$ and $P_{AI\_OUT}$) may be configured in various combinations, and an impedance matching value (for example, one of $C_{MX}(0), \ldots, C_{MX}(N)$) may be correlated to each combination.

Figure 11:
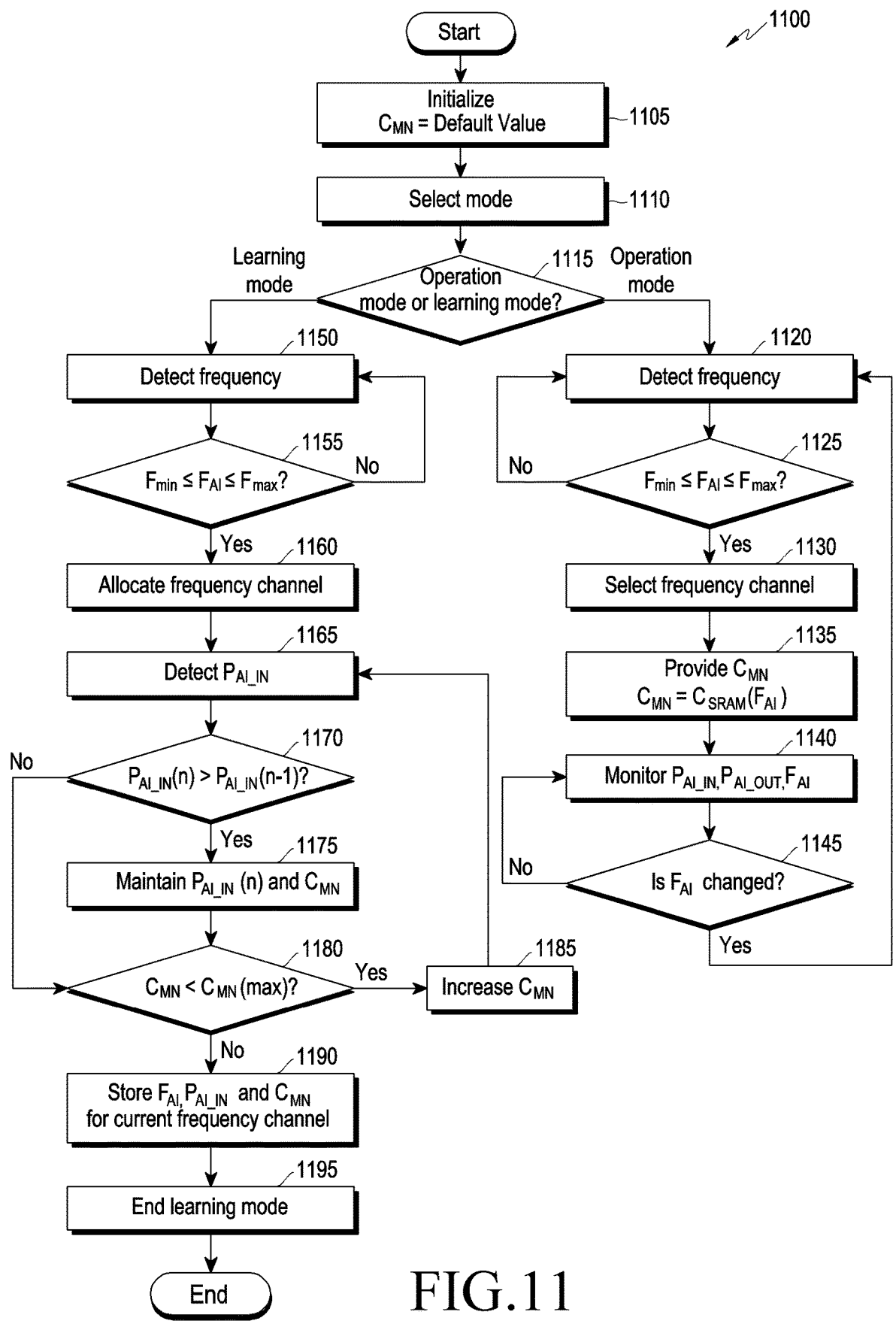
FIG. 11 is a flowchart illustrating an example operation of an electronic device according to various embodiments.

FIG. 11 is a flowchart 1100 illustrating an example operation of an electronic device according to various embodiments. FIG. 11 illustrates an example operation for performing an adaptive impedance matching method, and an operation method may include operations 1105 to 1195. Each step/operation in the operation method may be performed by at least one of the electronic devices (for example, the electronic device 150 of FIGS. 1 and 2) or at least one processor of the electronic device (for example, the control circuit 152 of FIG. 1 and the control circuit 404 of FIG. 4). In an embodiment, at least one of operations 1105 to 1195 may be omitted, the sequence of some operations may be changed, or other operations may be added.

Hereinafter, the operation of the electronic device 400 is described by way of example.

In operation 1105, when power is initially turned on or charging is initially started, an impedance value of the second impedance matching circuit 403 may be configured as a default value by a control signal (for example, $C_{MN}$). For example, an impedance value within the second impedance matching circuit 403 may be set as a default value. The operation of setting the default value may be referred to as an initialization operation. In operation 1110, the electronic device 400 may select whether to operate in a learning mode for acquiring matching information for each frequency or an operation mode using learned matching information. For example, when an impedance matching network model using the learned matching information exists, it may be selected that the electronic device starts in the operation mode automatically or by a user selection. Accordingly, the electronic device 400 may determine whether to operate in the operation mode or the learning mode in operation 1115.

In the case of the operation mode, the electronic device 400 may detect a frequency in operation 1120. In operation 1125, the electronic device 400 may determine whether the detected frequency (for example, $F_{AI}$) is between a minimum frequency (for example, $F_{min}$) and a maximum frequency (for example, $F_{max}$). For example, it may be determined whether the detected frequency is a normal frequency within an error range.

If the detected frequency (for example, $F_{AI}$) is between the minimum frequency (for example, $F_{min}$) and the maximum frequency (for example, $F_{max}$), the electronic device 400 may select a frequency channel in operation 1130. For example, the electronic device may identify a frequency range which the detected frequency (for example, $F_{AI}$) is in, and select an operation frequency range, that is, a frequency channel. In operation 1135, the electronic device 400 may provide a control signal (for example, $C_{MN}(F_{AI})$) corresponding to the detected frequency (for example, FAT) to the second impedance matching circuit 403. Since the impedance value is changed in accordance with the control signal (for example, $C_{MN}$ ($F_{AI}$), the next power signal may be adjusted to have maximum power and output from the output terminal of the second impedance matching circuit 403. Accordingly, in operation 1140, the electronic device 400 may continuously monitor power (for example, $P_{AI\_IN}$) and the frequency (for example, $F_{AI}$) in the output terminal of the second impedance matching circuit 403 and power (for example, $P_{AI\_OUT}$) in the output terminal of the RF-DC converter 406.

In operation 1145, when the frequency (for example, $F_{AI}$) in the output terminal of the second impedance matching circuit 403 is changed on the basis of the monitoring result in operation 1145, operations 1125 to 1145 for finding the matching information corresponding to the changed frequency in operation 1120 and changing impedance matching may be repeatedly performed. As described above, the electronic device 400 may continuously (or sequentially) monitor the input frequency, the input power, and the output power and, when the frequency is changed or the output power is rapidly reduced, may perform an operation of loading again the control signal causing maximum power by returning to the operation of changing the control signal ($C_{MN}$) to the default value and detecting the frequency once again.

In the case of the learning mode, the electronic device 400 may detect the frequency in operation 1150. Since operations 1150 to 1160 are the same as or similar to operations 1120 to 1130 in the learning mode, a detailed description thereof may not be repeated.

However, in operation 1160, the value for the frequency channel may be primarily set (e.g., allocated) in the learning mode. For example, the control signal may be configured as the value of $C_{MN}(0)$ for the input frequency (for example, Freq #1). Subsequently, in operation 1165, the electronic device 400 may detect power (for example, $P_{AI\_IN}(n)$) in the output terminal of the second impedance matching circuit 403.

In operation 1170, it may be determined whether power (for example, for $P_{AI\_IN}(n)$) in the output terminal of the second impedance matching circuit 403 is larger than previous power ($P_{AI\_IN}(n-1)$). When the power is larger than the previous power, the power and current control signal may be maintained in operation 1175. When the power is not larger than the previous power ($P_{AI\_IN}(n-1)$), it may be determined whether the current control signal (for example, $C_{MN}(n)$) is smaller than a maximum control signal (for example, $C_{MN}(max)$) in operation 1180. Operation 1180 may be an operation for determining whether the process of comparing the power magnitudes for all switching combinations is completed. When the current control signal (for example, $C_{MN}(n)$) is smaller than the maximum control signal (for example $C_{MN}(max)$), the value of the current control signal (for example, $C_{MN}(n)$) may be increased to compare the power magnitude corresponding to the next impedance value in operation 1185. Accordingly, the control signal, that is, the impedance value may be sequentially changed one by one. As described above, the impedance value may be changed until the series type, the parallel type, or a combination thereof for the second impedance matching circuit 403 are all satisfied.

Thereafter, when the current control signal (for example, $C_{MN}(n)$) is not smaller than the maximum control signal (for example, $C_{MN}(max)$ in operation 1180, that is, when the power magnitude comparison operation for all switch combinations is performed, the electronic device 400 may update the learning result by correlating the detected frequency (for example, $F_{AI}$), the detected power (for example, $P_{AI\_IN}(n)$), and the control signal (or impedance value) (for example, $C_{MN}(n)$) for the current frequency channel in operation 1190. For example, the impedance value which may cause the maximum power for the detected frequency may be correlated to correspond to the control signal to be applied to the second impedance matching circuit 403. On the basis of the learning result, the impedance matching value and the optimal values for the corresponding power and frequency may be learned, and the learning mode may end in accordance with the completion of storage in operation 1195.

Figure 12:
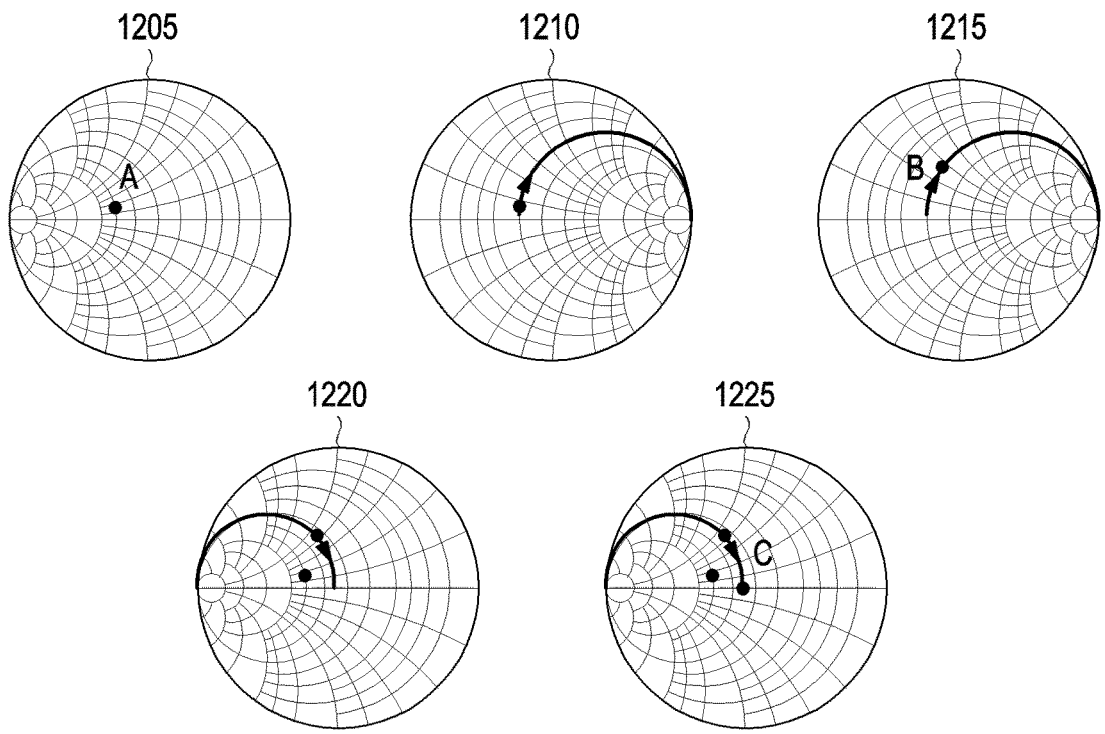
FIG. 12 is a diagram illustrating example images for a matching point changed through adaptive impedance matching according to various embodiments.

FIG. 12 is a diagram illustrating example images for a matching point changed through adaptive impedance matching according to various embodiments.

According to various embodiments, it may be noted through simulation that S11 (refer to FIG. 13) can move to a point corresponding to an optimal point as illustrated in FIG. 12 when impedance matching is performed. When a point value at a starting point A is initially S11 as indicated by reference numeral 1205, the point A may move to a point B along the circle if a series capacitance value increases from 1210 to 1225 on the basis of the point value. Further, when a parallel capacitance value increases at the point B, the point value may reach a final matching point C along the circle.

Figure 13:
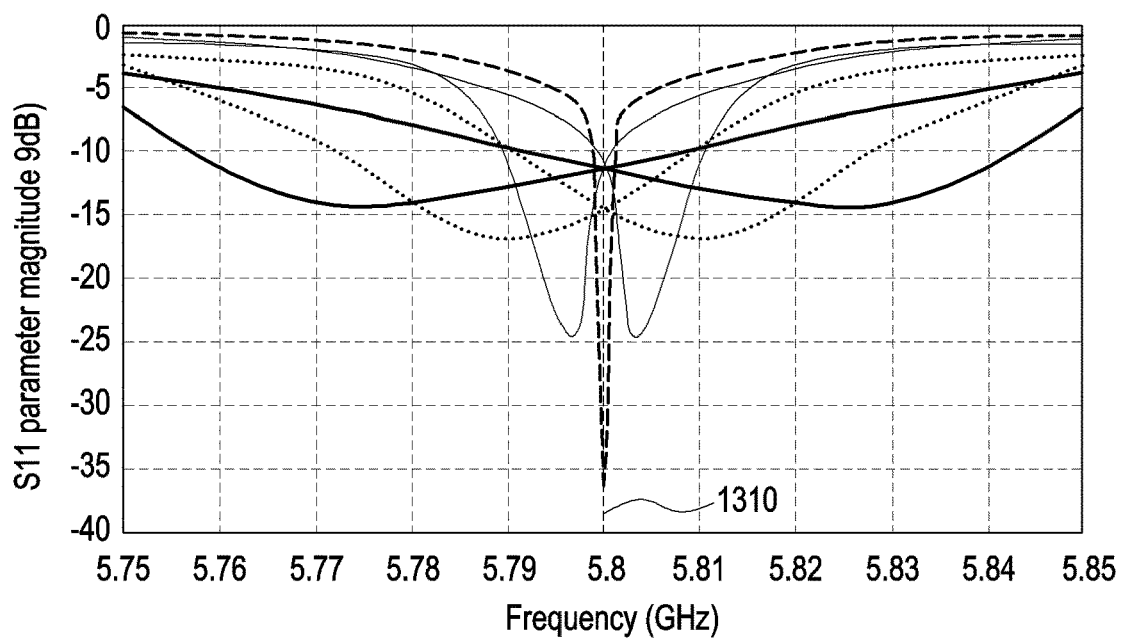
FIG. 13 is a graph illustrating an example frequency characteristic according to adaptive impedance matching according to various embodiments.

FIG. 13 is a graph illustrating an example frequency characteristic according to adaptive impedance matching according to various embodiments.

FIG. 13 illustrates a frequency characteristic when an impedance matching value which may cause maximum power is found in power signals in a band of 5.8 GHz corresponding to a wireless power reception frequency. FIG. 13 shows a characteristic when a value of S11 corresponding to a reflection coefficient is changed to a log scale in each matching point of FIG. 12. The reflection coefficient of S11 in the case in which impedance matching is performed at the central point of a Smith chart is lowest as indicated by reference number 1310, and it may be noted that the largest power for an input is applied to the corresponding part.

The electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. The electronic device according to embodiments of the disclosure is not limited to those described above.

It should be appreciated that various embodiments of the disclosure and the terms used therein are not intended to limit the technological features set forth herein to particular embodiments and include various changes, equivalents, and/or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

According to various embodiments, a storage medium storing instructions is provided. The instructions are configured to cause at least one circuit to perform at least one operation when executed by the at least one circuit. The at least one operation may performing second impedance matching on the first impedance-matched power signal through a second impedance matching circuit using one of a plurality of impedance values, performing control to change an impedance value of the second impedance matching circuit to an impedance value learned using an impedance matching network model in accordance with a power and a frequency of the second impedance-matched power signal, and converting a second impedance-matched power signal in an AC form to a charging power for a battery according to the changed impedance value.

The various example embodiments of the disclosure described and shown in the disclosure and the drawings have been presented to explain the technical contents of the disclosure and help understanding of the disclosure, and are not intended to limit the scope of embodiments of the disclosure. Therefore, the scope of the disclosure should be understood to include, in addition to the embodiments disclosed herein, all changes and modifications derived on the basis of the technical idea of the disclosure.

What is claimed is:

1. An electronic device comprising:
   a first impedance matching circuit configured to perform first impedance matching on a power signal wirelessly received from a wireless power transmission device;
   a second impedance matching circuit configured to perform second impedance matching on the first impedance-matched power signal using one of a plurality of impedance values;
   a control circuit configured to perform control to change an impedance value of the second impedance matching circuit to an impedance value learned using an impedance matching network model in accordance with a power and a frequency of the second impedance-matched power signal; and
   a power conversion circuit configured to convert the second impedance-matched power signal in an AC form into a power in a DC form for a battery according to the changed impedance value,
   wherein the impedance matching network model is configured to sequentially acquire second impedance-matched power signals using the plurality of impedance values, identify a maximum power signal among the second impedance-matched power signals based on a comparison between powers of the second impedance-matched power signals, and change the impedance value of the second impedance matching circuit to the learned impedance value, which is an impedance value corresponding to the maximum power signal, among the plurality of impedance values.

2. The electronic device of claim 1, wherein the second impedance matching circuit comprises a plurality of circuits corresponding to the plurality of respective impedance values, and the plurality of circuits comprise at least one capacitor and at least one switch configured to switch a short circuit of the at least one capacitor.

3. The electronic device of claim 1, wherein the impedance value learned using the impedance matching network model comprises an impedance value causing a maximum power of another power signal for a detected frequency among the plurality of impedance values, based on detection of a power and the frequency of the another power signal output from the second impedance matching circuit.

4. The electronic device of claim 1, wherein the control circuit is configured to perform control to detect power and a frequency of the second impedance-matched power signal in an input terminal of the power conversion circuit, identify an impedance value corresponding to the detected power and frequency using the impedance matching network model, and change the impedance value of the second impedance matching circuit to the identified impedance value.

5. The electronic device of claim 1, wherein the control circuit comprises:
   a power detection circuit configured to detect an input power between an output terminal of the second impedance matching circuit and an input terminal of the power conversion circuit and an output power in an output terminal of the power conversion circuit; and
   a frequency detection circuit configured to detect a frequency between the output terminal of the second impedance matching circuit and the input terminal of the power conversion circuit.

6. The electronic device of claim 1, wherein the power conversion circuit comprises an RF-DC converter configured to convert the second impedance-matched power signal in the AC form to the DC form according to the changed impedance value.

7. The electronic device of claim 6, wherein the power conversion circuit further comprises a regulator configured to rectify a power signal in a DC form output from the RF-DC converter to a voltage for the battery.

8. An electronic device comprising:
   an antenna configured to wirelessly receive a power signal;
   an impedance matching circuit configured to perform impedance matching on the power signal using one of a plurality of impedance values;
   at least one processor; and
   a memory,
   wherein the memory stores instructions configured to, when executed, cause the at least one processor to perform control to change an impedance value of the impedance matching circuit to an impedance value learned using an impedance matching network model in accordance with a power and a frequency of the impedance-matched power signal,
   wherein the impedance matching network model is configured to sequentially acquire second impedance-matched power signals using the plurality of impedance values, identify a maximum power signal among the second impedance-matched power signals, based on a comparison between powers of the second impedance-matched power signals, and change the impedance value of the impedance matching circuit to the learned impedance value, which is an impedance value corresponding to the maximum power signal, among the plurality of impedance values.

9. The electronic device of claim 8, further comprising a power conversion circuit configured to convert an impedance-matched power signal in an AC form to a power in a DC form for a battery according to the changed impedance value.

10. The electronic device of claim 8, wherein the impedance matching circuit comprises a plurality of circuits corresponding to the plurality of impedance values, and the plurality of circuits comprise at least one capacitor and at least one switch configured to switch a short circuit of the at least one capacitor.

11. The electronic device of claim 8, wherein the impedance value leaned using the impedance matching network model comprises an impedance value causing a maximum power of another power signal for a detected frequency among the plurality of impedance values, based on detection of a power and the frequency of the another power signal output from the second impedance matching circuit.

12. The electronic device of claim 9, wherein the instructions, when executed, cause the at least one processor to: detect an input power between an output terminal of the impedance matching circuit and an input terminal of the power conversion circuit and an output power in an output terminal of the power conversion circuit and detect a frequency between the output terminal of the impedance matching circuit and the input terminal of the power conversion circuit.

13. A method for performing adaptive impedance matching by an electronic device, the method comprising;
   performing first impedance matching on a wirelessly received power signal through a first impedance matching circuit;
   performing second impedance matching on the first impedance-matched power signal through a second impedance matching circuit using one of a plurality of impedance values;
   controlling to change an impedance value of the second impedance matching circuit to an impedance value learned using an impedance matching network model in accordance with a power and a frequency of the second impedance-matched power signal; and
   converting a second impedance-matched power signal in an AC form to a power in a DC form for a battery according to the changed impedance value,
   wherein the impedance matching network model is configured to sequentially acquire second impedance-matched power signals using the plurality of impedance values, identify a high power signal among the second impedance-matched power signals based on a comparison between powers of the second impedance-matched power signals, and change the impedance value of the second impedance matching circuit to the learned impedance value, which is an impedance value corresponding to the high power signal, among the plurality of impedance values.

* * * * *